(12) United States Patent
Yoshizawa et al.

(10) Patent No.: US 7,965,135 B2
(45) Date of Patent: Jun. 21, 2011

(54) CHARGE SAMPLING FILTER CIRCUIT AND CHARGE SAMPLING METHOD

(75) Inventors: Atsushi Yoshizawa, Tokyo (JP); Sachio Iida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/092,793

(22) PCT Filed: Sep. 6, 2007

(86) PCT No.: PCT/JP2007/067398
§ 371 (c)(1),
(2), (4) Date: May 6, 2008

(87) PCT Pub. No.: WO2008/032635
PCT Pub. Date: Mar. 20, 2008

(65) Prior Publication Data
US 2009/0160577 A1    Jun. 25, 2009

(30) Foreign Application Priority Data

Sep. 11, 2006   (JP) .................................. 2006-246001

(51) Int. Cl.
*H04B 1/10* (2006.01)
*H03H 7/00* (2006.01)
(52) U.S. Cl. ......... 327/554; 333/173; 333/176; 455/307
(58) Field of Classification Search .................. None
See application file for complete search history.

(56) References Cited

U.S. PATENT DOCUMENTS

| | | | | |
|---|---|---|---|---|
| 5,440,306 A * | 8/1995 | Tatsumi | .......... | 341/150 |
| 5,986,497 A * | 11/1999 | Tsugai | .......... | 327/554 |
| 7,327,182 B2 * | 2/2008 | Dosho et al. | .......... | 327/337 |
| 2002/0172170 A1 | 11/2002 | Muhammad et al. | | |
| 2003/0050027 A1 | 3/2003 | Muhammad et al. | | |
| 2005/0275026 A1 * | 12/2005 | Tsividis et al. | .......... | 257/350 |
| 2009/0015306 A1 * | 1/2009 | Yoshizawa et al. | .......... | 327/231 |

(Continued)

FOREIGN PATENT DOCUMENTS

JP    60-74711    4/1985

(Continued)

OTHER PUBLICATIONS

L. Carley et al., "High-Speed Low-Power Integrating CMOS Sample-and-Hold Amplifier Architecture", Proceeding of IEEE 1995 Custom Integrated Circuits Conference, pp. 543-546 (1995).

(Continued)

*Primary Examiner* — Lincoln Donovan
*Assistant Examiner* — Terry L Englund
(74) *Attorney, Agent, or Firm* — Finnegan, Henderson, Farabow, Garrett and Dunner, L.L.P.

(57) ABSTRACT

To provide a charge sampling filter circuit and a charge sampling method.

A charge sampling filter circuit includes a first capacitor that samples an input signal, and in which at least a portion of electric charge stored in the first capacitor by sampling is output to a second capacitor that is connectable with the first capacitor. The charge sampling filter circuit is characterized by including a switching portion that switches a circuit mode including a sampling mode that causes the first capacitor to sample the input signal, and an output mode that causes the first capacitor and the second capacitor to be connected. A capacitance value of the first capacitor in the output mode is set to be lower than the capacitance value in the sampling mode.

13 Claims, 12 Drawing Sheets

U.S. PATENT DOCUMENTS

2009/0021297 A1* 1/2009 Yoshizawa et al. ........... 327/554
2009/0135039 A1* 5/2009 Iida et al. ...................... 341/143

FOREIGN PATENT DOCUMENTS

JP 6-164323 6/1994
JP 2007-174629 7/2007

OTHER PUBLICATIONS

Y. Tsividis et al., "Strange ways to use the MOSFET", IEEE International Symposium on Circuits and Systems, pp. 449-452 (1997).

P. Andreani et al., "On the Use of MOS Varactors in RF VCO's", IEEE Journal of Solid-State Circuits, pp. 905-910 (2000), vol. 35, No. 6.

R. Bagheri et al., "An 800MHz to 5GHz Software-Defined Radio Receive in 90nm CMOS", 2006 IEEE International Solid-State Circuits Conference 26.6.

Ranganathan at al., "Discrete-Time Parametric Amplification Based on a Three-Terminal MOS Varactor: Analysis and Experimental Results", IEEE Journal of Solid-State Circuits, vol. 38, No. 12, pp. 2087-2093 (2003).

J. Yuan, "A Charge Sampling Mixer with Embedded Filter Function for Wireless Applications," Proceedings of IEEE 2000 International Conference on Microwave and Millimeter Wave Technology, pp. 315-318 (2000).

F. Chen et al., "A 0.25-mW Low-Pass Passive Sigma-Delta Modulator with Built-In Mixer for a 10-MHz IF Input", IEEE Journal of Solid-State Circuits, vol. 32, No. 6, pp. 774-782 (1997).

A. Mirzaei et al., "A Second-Order Anti-aliasing Prefilter for a SDR Receiver", IEEE 2005 Custom Integrated Circuits Conference, pp. 629-632 (2005).

A. Latiri et al., "A reconfigurable RF sampling receiving for multistandard applications", C. R. Physique, vol. 7, pp. 785-793 (2006).

Supplementary European Search Report dated in Mar. 10, 2010, in EP 07 80 6839.

* cited by examiner

FIG.5
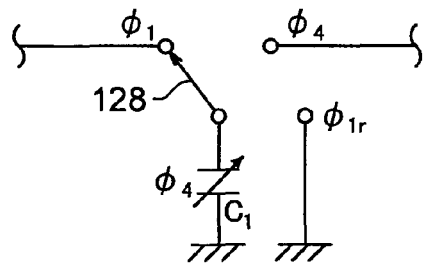
FIG.6
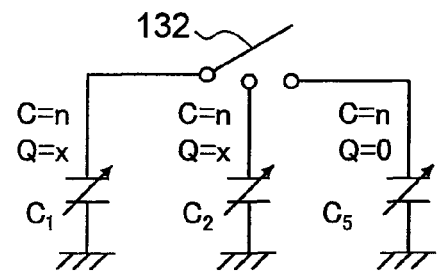
(a)
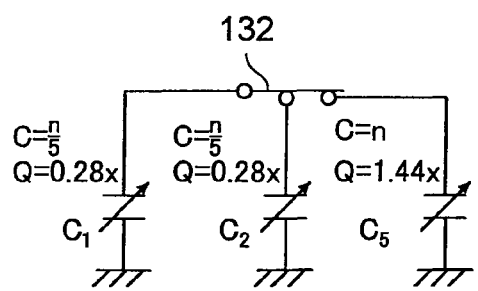
(b)
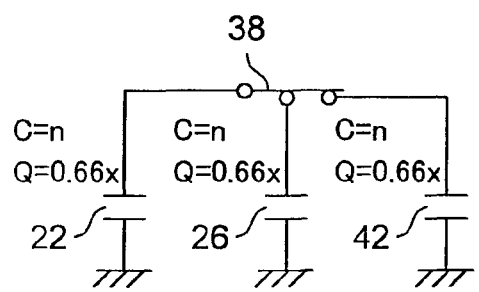
(c)

FIG.8
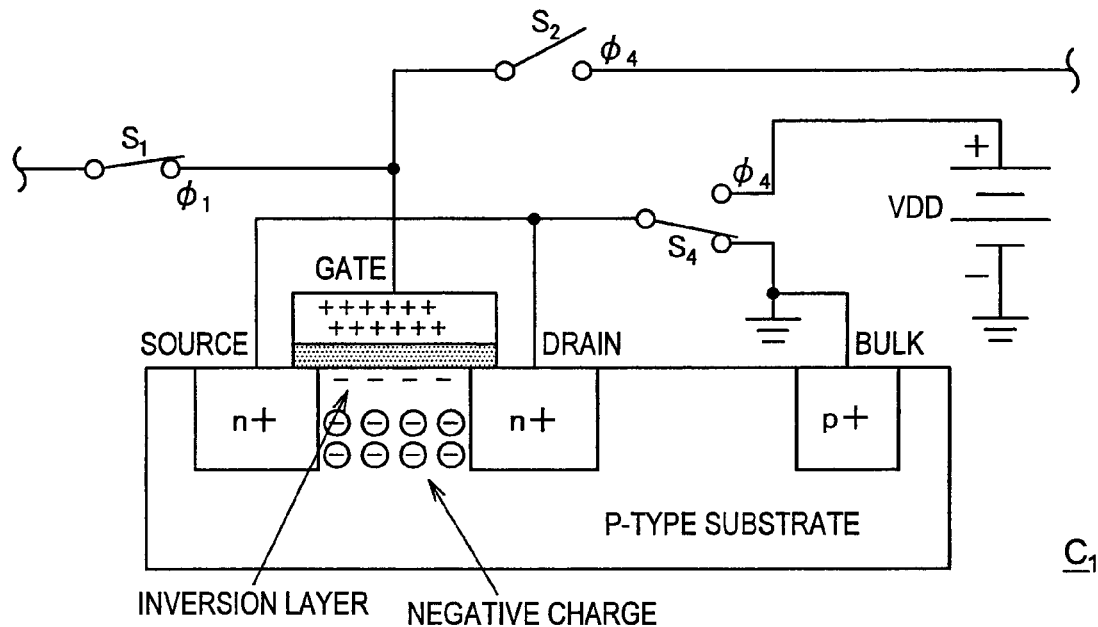
(a)
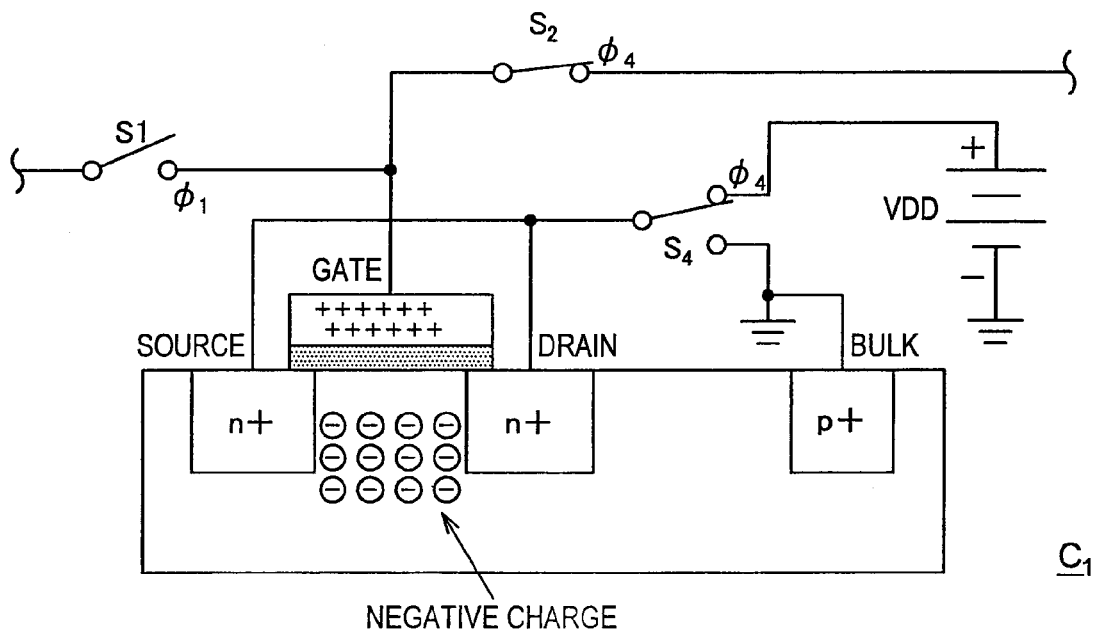
(b)

CHARGE SAMPLING FILTER CIRCUIT AND CHARGE SAMPLING METHOD

TECHNICAL FIELD

The present invention relates to a charge sampling filter circuit and a charge sampling method.

BACKGROUND ART

Recently, wireless services using high frequencies such as mobile phone services, wireless LAN (Local Area Network) and the like are becoming increasingly popular. Such wireless services generally use a frequency band that is different for each wireless service or for each area in which the wireless service is provided. Given these background circumstances, attention is being focused on reconfigurable RF technology that can use a plurality of wireless services at one wireless terminal. For example, as an example of reconfigurable RF technology that can receive wireless signals for different frequency bands using one RF circuit, a charge domain filter circuit is proposed (refer to Non-Patent Literature 1). Next, the charge domain filter circuit will be explained simply with reference to FIG. 10.

FIG. 10 is an explanatory figure that shows the circuit configuration of a charge domain filter circuit 10. The charge domain filter circuit 10 includes a transconductor (gm) 12, an IIR capacitor 14, a first charge sample circuit 20, a second charge sample circuit 40, and an output capacitor 50. In addition, the charge domain filter circuit 10 operates based on a control signal output by a circuit control device (not shown in the figures).

The transconductor 12 is a voltage-current converter that coverts a voltage of an input signal to a current that is proportional to the voltage, and outputs the current. The IIR capacitor 14 is connected to the transconductor 12, and functions to attribute IIR (Infinite Impulse Response) characteristics to the charge domain filter circuit 10.

The first charge sample circuit 20 includes capacitors 22, 26, 30 and 34. For example, while a control signal $\phi 1$ input to the charge domain filter circuit 10 has a high level, a switch 21 is switched on, and the capacitor 22 is charged by (charging) the current output by the transconductor 12. Further, while a control signal $\phi 2$ input to the charge domain filter circuit 10 has a high level, a switch 25 is switched on, and the capacitor 26 is charged by the current output by the transconductor 12.

Next, while control signals $\phi 4$ and $\psi 1$ input to the charge domain filter circuit 10 have a high level, switches 23, 27 and 41 are switched on. As a result, part of the electric charge stored by charging in the capacitors 22 and 26 is output to a capacitor 42 of the second charge sample circuit 40. Then, electric charge that accords with a capacitance value of the capacitors 22, 26 and 42 is stored in the capacitors 22, 26 and 42 respectively until an equilibrium state is reached. Hereinafter, sharing of electric charge among a plurality of capacitors in this manner is referred to as charge sharing.

Following this, while a control signal $\phi 1r$ input to the charge domain filter circuit 10 has a high level, a switch 24 is switched on, and remaining electric charge of the capacitor 22 is discharged. Moreover, while a control signal $\phi 2r$ input to the charge domain filter circuit 10 has a high level, a switch 28 is switched on and remaining electric charge of the capacitor 26 is discharged. Similarly, following discharging of the current supplied by the transconductor 12, the capacitors 30 and 34 perform charge sharing, and electric charge remaining in the capacitors 30 and 34 is discharged in preparation for the next charging.

Non-Patent Literature 1: 2006 IEEE International Solid-State Circuits Conference 26.6, "An 800 MHz to 5 GHz Software-Defined Radio Receiver in 90 nm CMOS"

DISCLOSURE OF THE INVENTION

Problems that the Invention is to Solve

However, in the known charge domain filter circuit, after the capacitors are charged by current and perform charge sharing, a problem may occur in which a large amount of the electric charge remaining in the capacitors is discharged. For example, if charge sharing is being performed between a first capacitor and a capacitor in a following stage that has the same capacitance, electric charge will be equally divided between the first capacitor and the capacitor in the following stage. As a result, half of the electric charge held in the first capacitor remains, and half of the electric charge is discharged from the first capacitor. In other words, in the known charge domain filter circuit, a problem occurs, namely, a large amount of signal information is lost as a result of discharging the remaining electric charge in the capacitor, and, at the same time, the gain as a filter circuit is reduced.

Given this, the present invention has been devised in light of the above-described problems. It is an object of the present invention to provide a new and innovative charge sampling filter circuit and charge sampling method that can reduce electric charge that is discharged from capacitors that form a circuit.

Means for Solving the Problems

In order to address the above problems, according to an aspect of the present invention, a charge sampling filter circuit is provided which includes a first capacitor that samples an input signal, and in which at least a portion of electric charge stored in the first capacitor by sampling is output to a second capacitor that is connectable with the first capacitor. The charge sampling filter circuit includes: a switching portion that switches a circuit mode including a sampling mode that causes the first capacitor to sample the input signal, and an output mode that causes the first capacitor and the second capacitor to be connected, and is characterized in that a capacitance value of the first capacitor in the output mode is set to be lower than the capacitance value in the sampling mode.

In the above configuration, at least the one first capacitor samples the input signal at the capacitance value that is higher than in the output mode, and outputs at least the portion of the electric charge to the second capacitor at the capacitance value that is lower than in the sampling mode, namely, performs charging sharing with the second capacitor. Normally, when charge sharing is performed, electric charge that is proportional to the respective capacitance values of the respective previous stage capacitor (in other words, the first capacitor) and the following stage capacitor (in other words, the second capacitor) is shared. As a result, when shifting to the output mode, if control is performed such that the capacitance value of the previous stage capacitor is deliberately reduced as compared to in the sampling mode, the electric charge amount transferred to the following stage capacitor can be increased. For example, it is possible to reduce the electric charge amount remaining in the previous stage capacitor after charge sharing to around ¼ to ⅕. Thus, in the first capacitor, the electric charge discharged after charge sharing can be reduced, thereby allowing the promotion of improvement in gain as the entire charge sampling filter circuit.

The switching portion may switch the circuit mode based on a mode switching signal input in synchronization with a clock, and the capacitance value of the first capacitor may be changed based on a capacitance value control signal input in synchronization with the clock. In this configuration, for example, a circuit control device connected to the charge sampling filter circuit may generate and output the mode switching signal based on a set frequency characteristic. In addition, the circuit control device may generate and output the capacitance value control signal based on a set capacitor characteristic. As a result, the charge sampling filter circuit can, while retaining its configuration, vary the circuit characteristic by just varying the input mode switching signal and the capacitance value control signal.

The capacitance value control signal that reduces the capacitance value of the first capacitor may have the same phase as the mode switching signal that instructs the switching portion to switch the circuit mode to the output mode. According to this configuration, the circuit control device can make the mode switching signal, which instructs the circuit mode of the charge sampling filter circuit to switch to the output mode, also function as the capacitance value control signal that reduces the capacitance value of the first capacitor. Accordingly, a process of generating the capacitance value control signal can be omitted, thereby promoting simplification of the processing process and cost reduction.

The capacitance value control signal that reduces the capacitance value of the first capacitor may be input to the first capacitor during a specified period including an output mode period that is when the circuit mode is the output mode. In this configuration, the capacitance value control signal is input to the first capacitor even in the period immediately before the output mode period and/or the period immediately after the output mode period. For example, if the capacitance value control signal is input to the first capacitor from before the output mode period, when switching to the output mode, the capacitance value of the first capacitor can be adequately reduced. In other words, if the capacitance value of the first capacitor is reduced, the potential of the first capacitor is increased in accordance with the expression [Q=CV], thereby making it possible to transfer electric charge (flow of current) at a speed based on the difference with the potential of the second capacitor at the same time as when the output mode is switched to.

The capacitance value of the first capacitor may be varied during times other than the period when the circuit mode is the output mode. In this configuration, if the capacitance value of the first capacitor is varied, the potential of the first capacitor is varied in accordance with the expression [Q=CV]. Accordingly, if, for example, the capacitance value of the first capacitor can be varied even in a period when the circuit mode is the sampling mode, the voltage generated in the first capacitor by sampling is also varied, thereby gain as the entire charge sampling filter circuit to be adjusted.

The circuit mode may additionally include a discharge mode that discharges electric charge stored in the first capacitor, and the switching portion may switch the circuit mode to the discharge mode from the end of a period when the circuit mode is the output mode until the start of a period when the circuit mode is the sampling mode. According to this configuration, the circuit mode is switched to the sampling mode again after a charge state of the first capacitor is initialized following discharge of the electric charge of the first capacitor. Accordingly, it is possible to inhibit the occurrence of the problem of electric charge being accumulatively stored in the first capacitor and causing voltage saturation.

The capacitance value of the first capacitor in the discharge mode may be approximately the same as the capacitance value of the first capacitor in the output mode. According to this configuration, the first capacitor samples the input signal, for example, after an initial value of the electric charge has been set by an initialization voltage (Vbias) in the same state as in the output mode where the capacitance value is low. As a result, the input signal becomes equivalent to the difference with respect to variation of DC level in the output mode, and thus the error component in the output mode can be reduced.

The first capacitor may be selectively operated to have a variable capacitance that varies the capacitance value in accordance with the circuit mode, or to have a fixed capacitance. According to this configuration, by suitably performing the above selection in accordance with the usage, objective or the like of the charge sampling filter circuit, the signal level in the charge sampling filter circuit when large signals are being input can be adjusted, thereby allowing a substantial reduction in signal distortion caused by saturation of the voltage in the circuit.

In addition, the above charge sampling filter circuit may further include a unit capacitor group including at least two or more capacitors, and a second switching portion that switches a circuit mode of the unit capacitor group that includes a sampling mode and an output mode. When the circuit mode of the unit capacitor group is switched to the sampling mode by the second switching portion, a plurality of capacitors included in the unit capacitor group may perform sampling, and when the circuit mode of the unit capacitor group is switched to the output mode by the second switching portion, at least one of the capacitors among the plurality of capacitors may output electric charge stored by the sampling.

In the above configuration, when the circuit mode of the unit capacitor group is the sampling mode, the plurality of capacitors included in the unit capacitor group sample the input signal. Furthermore, when the circuit mode of the unit capacitor group is the output mode, electric charge stored in the at least one capacitor among the plurality of capacitors is output. In other words, the signal input to the given capacitor group is output with a section of the signal component removed. Accordingly, in the case that a high level signal is input to the charge sampling circuit, the signal component can be attenuated by the unit capacitor group.

At least one of the capacitors included in the unit capacitor group may be a variable capacitor having a variable capacitance value. The ratio of the signal component input to the unit capacitor group and the signal component output from the unit capacitor group is based on the ratio of the total electrical capacitance of the plurality of capacitors and the total of the electrical capacitance of the at least one of the capacitors among the plurality of capacitors. Accordingly, by making the at least one of the capacitors included in the unit capacitor group a variable capacitor, for example, it is possible to adjust an attenuation amount of the signal component of the unit capacitor group.

In the unit capacitor group, the plurality of capacitors and/or the at least one of the capacitors among the plurality of capacitors may be selected in accordance with a signal level of a signal input to the charge sampling filter circuit. For example, if the signal level is high, and a high attenuation amount is desired, more capacitors may be selected as the plurality of capacitors, and fewer capacitors may be selected as the at least one capacitor among the plurality of capacitors.

The circuit mode of the unit capacitor group may additionally include a discharge mode that discharges electric charge stored in the plurality of capacitors, and the second switching portion may switch the circuit mode of the unit capacitor group to the discharge mode from the end of a period when the circuit mode is the output mode until the start of a period when the circuit mode is the sampling mode. According to the above configuration, the circuit mode of the unit capacitor group is switched to the sampling mode again after a charge state of the plurality of capacitors is initialized following discharge of the electric charge of the plurality of capacitors. Accordingly, it is possible to inhibit occurrence of the problem of electric charge being accumulatively stored in the plurality of capacitors and causing voltage saturation.

Furthermore, in order to solve the above-described problems, another aspect of the present invention provides a charge sampling method that is characterized by comprising: a sampling step of sampling an input signal by a first capacitor; a step of reducing a capacitance value of the first capacitor; an output step of outputting at least a portion of electric charge stored in the first capacitor by the sampling to a second capacitor that is connected to the first capacitor, and a discharge step of discharging electric charge stored in the first capacitor.

Advantage of the Invention

According to the charge sampling filter circuit and the charge sampling method of the present invention described above, electric charge discharged from capacitors that form a circuit can be reduced.

BRIEF DESCRIPTION OF THE DRAWINGS

FIG. 5 An explanatory figure that shows an example of another structure of a switching portion.

FIG. 6 An explanatory figure that shows a situation where an equilibrium state has been reached of capacitors C1, C2 and C5 of the charge domain filter circuit.

FIG. 8 An explanatory figure that shows another example of a control signal input to the charge domain filter circuit.

DESCRIPTION OF REFERENCE NUMERALS AND SIGNS

Figure 1:
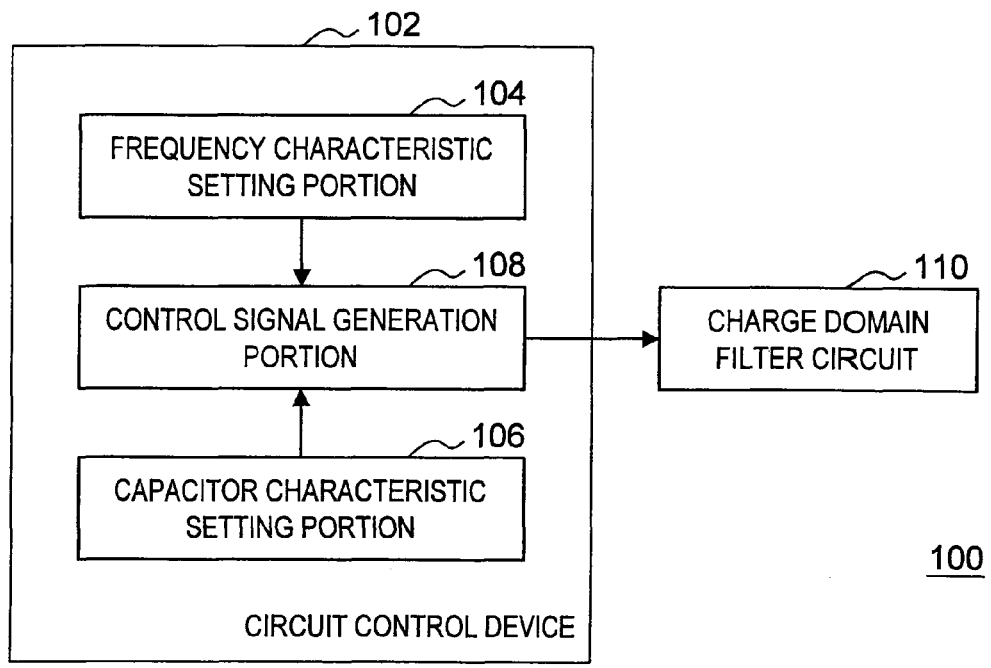
FIG. 1 An explanatory figure that shows the configuration of a filtering system to which a charge domain filter circuit of a first embodiment of the present invention is applied.

100 Filtering system
102 Circuit control device
108 Control signal generation portion
110, 111, 112 Charge domain filter circuit

BEST MODE FOR CARRYING OUT THE INVENTION

Hereinafter a preferred mode of the present invention will be explained in detail with reference to the appended drawings. In the specification and drawings, structural members that have substantially the same function or structure are denoted with the same reference characters, and repeated explanation is omitted.

With regard to the preferred mode of the present invention, first, an explanation will be given with reference to FIGS. 1 to 3 of a filtering system to which a charge domain filter circuit is applied as a charge sampling filter circuit according to a first embodiment of the present invention. Next, the structure and operation of the charge domain filter circuit according to the same embodiment will be explained with reference to FIGS. 4 to 6. Following this, an example of capacitors that form the charge domain filter circuit according to the same embodiment will be explained with reference to FIG. 8. Then, a modified example of the charge domain filter circuit according to the same embodiment will be explained with reference to FIG. 9. Furthermore, a charge domain filter circuit according to a second embodiment of the present invention will be explained with reference to FIG. 11 to FIG. 16.

First Embodiment

Figure 2:
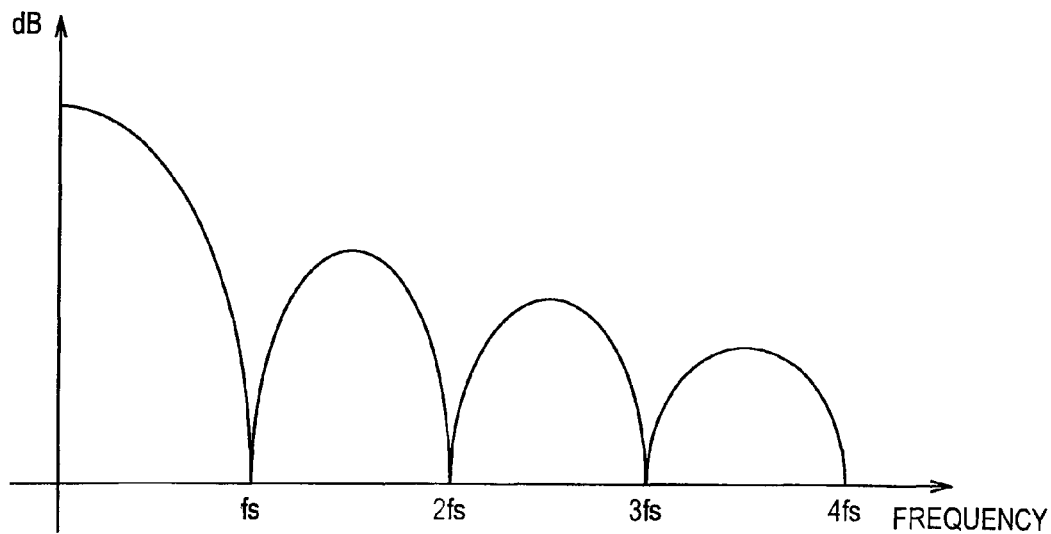
FIG. 2 An explanatory figure that shows a frequency characteristic of an output signal obtained by operation of the filtering system.

FIG. 1 is an explanatory figure that shows the configuration of a filtering system 100 to which a charge domain filter circuit 110 of the present embodiment is applied. FIG. 2 is an explanatory figure that shows a frequency characteristic of an output signal obtained by operation of the filtering system 100. FIG. 3 is an explanatory figure that shows a control signal output by a circuit control device.

The filtering system 100 includes a circuit control device 102, and a charge domain filter circuit 110. The circuit control device 102 outputs a control signal that controls the charge domain filter circuit 110. The charge domain filter circuit 110 filters an input signal that is input from outside based on the control signal.

More particularly, the circuit control device 102 includes a frequency characteristic setting portion 104, a capacitor characteristic setting portion 106, and a control signal generation portion 108.

The frequency characteristic setting portion 104 sets a frequency characteristic (refer to FIG. 2) of an output signal obtained via the charge domain filter circuit 110. The frequency characteristic setting portion 104 may also include a user interface that is operated by a user in order to obtain a frequency characteristic desired by the user.

The capacitor characteristic setting portion 106 sets characteristic of a capacitor provided in the charge domain filter circuit 110. The characteristic of the capacitor is, for example, a capacitance value. The capacitor characteristic setting portion 106 may be configured such that it can set the timing at which the capacitance value of the capacitor is changed, or set the extent to which the capacitance value of the capacitor is reduced. Like the frequency characteristic setting portion 104, the capacitor characteristic setting portion 106 may also include a user interface that is operated by a user in order to obtain a capacitor characteristic desired by the user.

The control signal generation portion 108 generates a control signal to achieve the frequency characteristic and the capacitor characteristic of the charge domain filter circuit 110 set by the frequency characteristic setting portion 104 and the capacitor characteristic setting portion 106, and outputs the control signal to the charge domain filter circuit 110. The control signal includes, as shown in FIG. 3, for example, a plurality of signals with different phases generated based on a basic clock $\phi 0$. In addition, the control signal includes a mode switching signal for switching a circuit mode (circuit configuration) of the charge domain filter circuit 110, and a capacitance value control signal that changes the capacitor characteristic.

Figure 3:
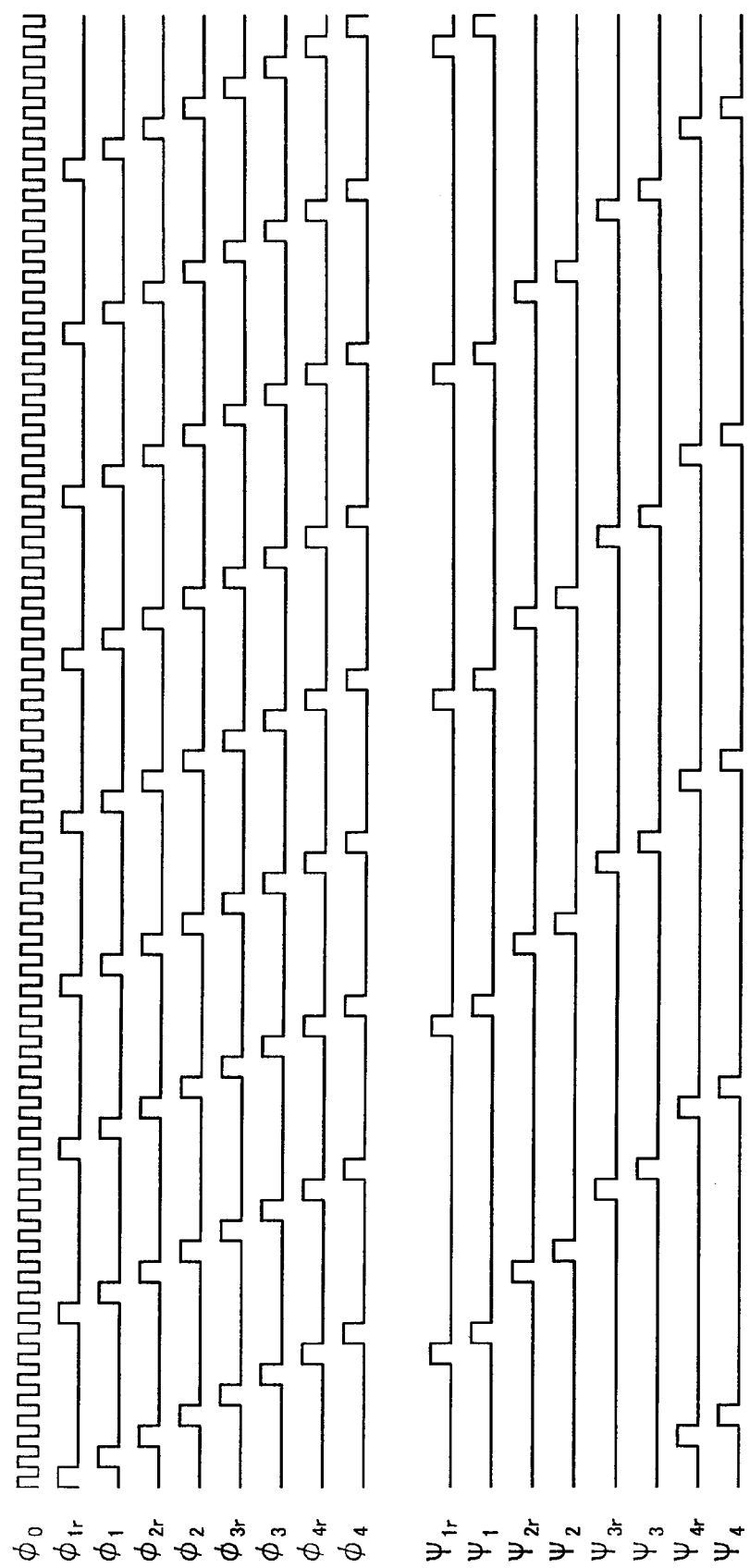
FIG. 3 An explanatory figure that shows a control signal supplied to the charge domain filter circuit.

The charge domain filter circuit 110 operates based on the control signal shown in FIG. 3 generated by the control signal generation portion 108 of the circuit control device 102, and filters the input signal. A signal output via a first charge sampling circuit portion 120, described hereinafter, that configures the charge domain filter circuit 110, has, for example, the frequency characteristic shown in FIG. 2.

As can be seen from FIG. 2, the frequency characteristic of the signal output via the first charge sampling circuit portion 120, described hereinafter, that configures the charge domain filter circuit 110 is a frequency fs specified in accordance with the cycle of the control signal generated by the control signal generation portion 108 and frequencies of integer multiples thereof reach a zero point or a null point. The given frequency characteristic has a similar shape to a SINC function, and thus a circuit that attributes this type of frequency characteristic is known as a SINC filter circuit. In addition, because the given frequency characteristic can only be changed by varying the control signal generated by the control signal generation portion 108, it is advantageous in that it is not necessary to provide a plurality of filter circuits to obtain different frequency characteristic Next, a circuit configuration of the charge domain filter circuit 110 will be explained in detail with reference to FIG. 4.

Figure 4:
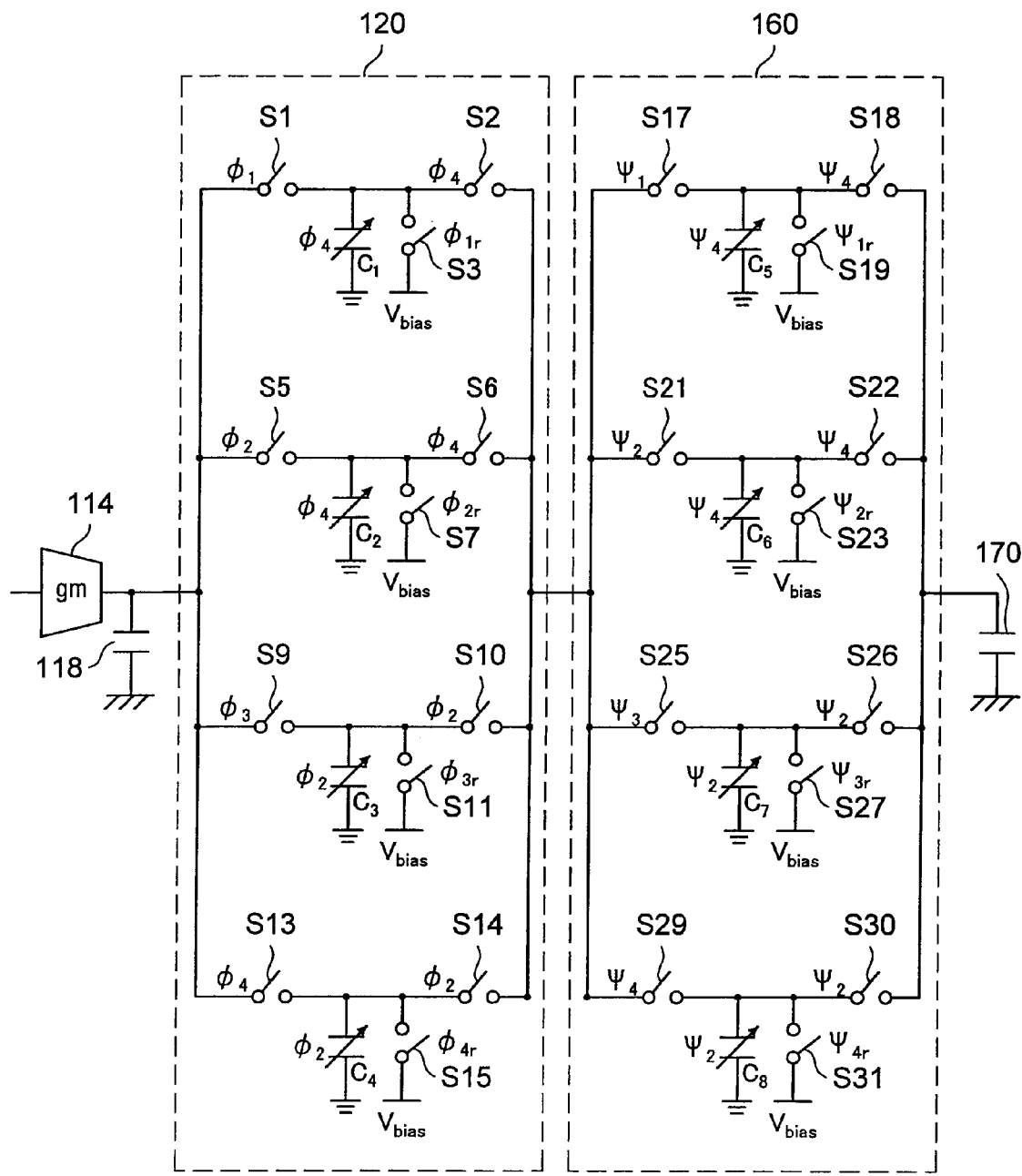
FIG. 4 An explanatory figure that shows a circuit configuration of the charge domain filter circuit of the same embodiment.

FIG. 4 is an explanatory figure that shows the circuit configuration of the charge domain filter circuit 110 of the present embodiment. The charge domain filter circuit 110 includes a transconductor (gm) 114, an IIR capacitor 118, the first charge sampling circuit portion 120, a second charge sampling circuit portion 160, and an output capacitor 170 on the inside or outside. In addition, the charge domain filter circuit 110 is input with the control signal shown in FIG. 3. Note that, hereinafter, an explanation will be given of an example in which the sampling speed of the first charge sampling circuit portion 120 is lowered to a ½ (decimation) at the second charge sampling circuit portion 160.

The transconductor 114 functions as a signal-current output portion that coverts a voltage of an input signal to a current that is proportional to the voltage, and outputs the current. The IIR capacitor 118 is connected to the transconductor 114, and functions to attribute IIR characteristics to the charge domain filter circuit 110. Note that, attributing the IIR characteristics to the charge domain filter circuit 110 is not a fundamental feature of the present embodiment and thus it is not essential to provide the IIR capacitor 118 in the charge domain filter circuit 110.

The first charge sampling circuit portion 120 includes capacitors C1, C2, C3 and C4, and, as switch portions, switches S1, S2, S3, S5, S6, S7, S9, S10, S11, S13, S14, and S15.

The capacitors C1, C2, C3 and C4 have a function of storing electric charge. Moreover, the capacitors C1, C2, C3 and C4 according to the present embodiment have the distinctive feature that they are formed by a varicap (varactor) diode using a MOS or a variable capacitance diode that has a variable capacitance. The above-mentioned MOS may be one that operates in an inversion mode or one that operates in an accumulation mode.

Furthermore, in the present embodiment, the $\phi 4$ written to the side of the capacitor C1 indicates that, while a control signal $\phi 2$ input to the charge domain filter circuit 110 has a high level, the capacitance value of the capacitor C1 reduces. The $\phi 2$ or $\phi 4$ written to the side of the capacitors C2, C3 and C4 have a similar meaning. Note that, the detailed structure of the above-described capacitors C1, C2, C3 and C4 will be explained later using FIG. 8.

The switch S1 is a switch that connects or disconnects the capacitor C1 and the transconductor 114. The $\phi 1$ written to the side of the switch S1 indicates that, while the control signal $\phi 1$ input to the charge domain filter circuit 110 has a high level, the switch S1 is closed and the capacitor C1 and the transconductor 114 are connected. In other words, $\phi 1$ functions as a mode switching signal that switches the circuit mode of at least a section of the charge domain filter circuit 110. The control signals $\phi 2$ to $\phi 4$, control signals $\phi 1r$ to $\phi 4r$, control signals $\psi 1$ to $\psi 4$, and control signals $\psi 1r$ to $\psi 4r$ similarly function as mode switching signals.

The switch S2 is a switch that connects or disconnects the capacitor C1, the capacitor C2, and the capacitor C5 or C7 of the second charge sampling circuit portion 160. The $\phi 4$ written to the side of the switch S2 indicates that, while the control signal $\phi 4$ input to the charge domain filter circuit 110 has a high level, the switch S2 is closed, and the capacitor C1, the capacitor C2, and the capacitor C5 or C7 of the second charge sampling circuit portion 160 are connected.

The switch S3 is a switch that connects or disconnects the capacitor C1 with Vbias. The $\phi 1r$ written to the side of the switch S3 indicates that, while the control signal $\phi 1r$ input to the charge domain filter circuit 110 has a high level, the switch S3 is closed and the capacitor C1 is connected with Vbias.

Like the switch S1, the switch S5 is a switch that connects or disconnects the capacitor C2 and the transconductor 114 based on the control signal $\phi 2$, the switch S9 is a switch that connects or disconnects the capacitor C3 and the transconductor 114 based on the control signal $\phi 3$, and the switch S13 is a switch that connects or disconnects the capacitor C4 and the transconductor 114 based on the control signal $\phi 4$.

Like the switch S2, the switch S6 is a switch that connects or disconnects the capacitor C1, the capacitor C2, and the capacitor C5 or C7 of the second charge sampling circuit portion 160 based on the control signal $\phi 4$, the switch S10 is a switch that connects or disconnects the capacitor C3, the capacitor C4, and the capacitor C6 or C8 of the second charge sampling circuit portion 160 based on the control signal $\phi 2$, and the switch S14 is a switch that connects or disconnects the capacitor C3, the capacitor C4, and the capacitor C6 or C8 of the second charge sampling circuit portion 160 based on the control signal φ4.

Like the switch S3, the switch S7 is a switch that connects or disconnects the capacitor C2 with Vbias based on the control signal φ2r, the switch S11 is a switch that connects or disconnects the capacitor C3 with Vbias based on the control signal φ3r, and the switch S15 is a switch that connects or disconnects the capacitor C4 with Vbias based on the control signal φ4r.

The second charge sampling circuit portion 160 includes capacitors C5, C6, C7 and C8, and switches S17, S18, S19, S21, S22, S23, S25, S26, S27, S29, S30 and S31.

The capacitors C5, C6, C7 and C8 have a function of storing electric charge. Moreover, the capacitors C5, C6, C7 and C8 according to the present embodiment have the distinctive feature that they are formed by a varicap (varactor) diode using a MOS or a variable capacitance diode that can vary the C5, C6, C7, and C8 capacitance. In addition, during the period when the control signal ψ4 input to the charge domain filter circuit 110 has a high level, the capacitance value of the capacitors C5 and C6 reduce, and during the period when the control signal ψ2 input to the charge domain filter circuit 110 has a high level, the capacitance value of the capacitors C7 and C8 reduce.

The switch S17 is a switch that connects or disconnects the capacitors C1 and C2 of the first charge sampling circuit portion 120 and the capacitor C5. The ψ1 written to the side of the switch S17 indicates that, while the control signal ψ1 input to the charge domain filter circuit 110 has a high level, the switch S17 is closed and the capacitors C1 and C2, and the capacitor C5 are connected.

The switch S18 is a switch that connects or disconnects the capacitor C5, the capacitor C6 and the output capacitor 170. The ψ4 written to the side of the switch S18 indicates that, while the control signal ψ4 input to the charge domain filter circuit 110 has a high level, the switch S18 is closed and the capacitors C5 and C6, and the output capacitor 170 are connected.

The switch S19 is a switch that connects or disconnects the capacitor C5 with Vbias. The ψ1r written to the side of the switch S19 indicates that, while the control signal ψ1r input to the charge domain filter circuit 110 has a high level, the switch S19 is closed and the capacitor C5 is connected with Vbias.

Like the switch S17, the switch S21 connects or disconnects the capacitors C3 and C4 of the first charge sampling circuit portion 120 and the capacitor C6 based on the control signal ψ2, the switch S25 connects or disconnects the capacitors C1 and C2 of the first charge sampling circuit portion 120 and the capacitor C7 based on the control signal ψ3, and the switch S29 connects or disconnects the capacitors C3 and C4 of the first charge sampling circuit portion 120 and the capacitor C8 based on the control signal ψ4.

Like the switch S18, the switch S22 connects or disconnects the capacitor C5, the capacitor C6 and the output capacitor 170 based on the control signal ψ4, the switch S26 connects or disconnects the capacitor C7, the capacitor C8 and the output capacitor 170 based on the control signal ψ2, and the switch S30 connects or disconnects the capacitor C7, the capacitor C8 and the output capacitor 170 based on the control signal ψ2.

Like the switch S19, the switch S23 connects or disconnects the capacitor C6 with Vbias based on the control signal ψ2r, the switch S27 connects or disconnects the capacitor C7 with Vbias based on the control signal ψ3r, and the switch S31 connects or disconnects the capacitor C8 with Vbias based on the control signal ψ4r.

The output capacitor 170 has, for example, capacitance for extracting output from the charge domain filter circuit 110, and may be an A/D converter.

Hereinabove, the structure of the charge domain filter circuit 110 has been explained. However, as will be readily apparent, the circuit configuration of the charge domain filter circuit 110 is not limited to that described above. For example, the switches S1, S2 and S3, as the switching portion, may have the structure shown in FIG. 5.

FIG. 5 is an explanatory figure that shows an example of another structure of the switching portion. As shown in the example structure, as the switching portion, a rotary type switch 128 may be provided instead of the switches S1, S2 and S3. More particularly, when the control signal φ1 input to the charge domain filter circuit 110 has a high level, the switch 128 is connected with a terminal on the transconductor 114 side, when the control signal φ4 input to the charge domain filter circuit 110 has a high level, the switch 128 is connected to a terminal on the second sampling filter circuit 160 side, and when the control signal φ1r input to the charge domain filter circuit 110 has a high level, the switch 128 is connected to a terminal on the Vbias side.

According to the above structure, the circuit mode can be switched in various ways using just the one switch 128. Furthermore, it is possible to inhibit current supplied from the transconductor 114 being discharged as it is when the switches S1 and S3 in FIG. 4 are simultaneously switched on.

Furthermore, the sampling filter circuit that configures the charge domain filter circuit 110 is not limited to having 2 stages, and may have just 1 stage or use a variety of combinations of three or more stages. Moreover, the number of capacitors C that configure each sampling filter circuit is not limited to 4, and 6 or a plurality of more than 6 capacitors may be used.

Next, the operation of the charge domain filter circuit 110 according to the present embodiment will be explained with reference to FIG. 3 and FIG. 4.

First, when the control signal φ1 input to the charge domain filter circuit 110 has a high level, the switch S1 is closed, and the circuit mode becomes the sampling mode in which the transconductor 114 and the capacitor C1 are connected. Note that, the above circuit mode does not necessarily indicate the overall circuit mode of the charge domain filter circuit 110, but means the circuit mode of, at the least, a circuit section that can cause a change in the state (for example, a sampling state, an output state, a discharge state, a maintaining state, or the like) of a targeted capacitor (in this case, the capacitor C1), namely, a circuit section that corresponds to a specified capacitor. For example, the circuit section that corresponds to the capacitor C1 includes S1, S2, S3 and S17 as the switching portion.

When the circuit mode switches to the sampling mode, the capacitor C1 samples the current as the input signal supplied from the transconductor 114 until a time t elapses from when the control signal φ1 input to the charge domain filter circuit 110 has changed to a high level. In other words, the current supplied from the transconductor 114 is sampled by Windowed Intergration Sampling or rectangular sampling.

Next, when the control signal φ2 input to the charge domain filter circuit 110 changes to a high level, the switch S5 is closed and the circuit mode switches to the sampling mode in which the transconductor 114 and the capacitor C2 are connected. Accordingly, the capacitor C2 samples the current supplied from the transconductor 114 until the time t elapses from when the control signal φ2 input to the charge domain filter circuit 110 has changed to the high level. Note that, during the period when the control signal φ3 input to the charge domain filter circuit 110 has a high level, the circuit mode of the circuit section that corresponds to the capacitor C1 and the circuit section that corresponds to the capacitor C2 is a maintaining mode that maintains the immediately previous charge state.

Furthermore, when the control signal φ4 and the control signal ψ1 input to the charge domain filter circuit 110 change to a high level, the switches S2, S6 and S17 are closed, the circuit mode changes to an output mode, and the capacitors C1, C2 and C5 are connected. Note that, the circuit mode corresponds to the output mode when viewed from the capacitor C1 and C2 side. However, when viewed from the capacitor C5 side it corresponds to the sampling mode, and the capacitors C1 and C2 correspond to a supply source of the input signal. Moreover, the capacitance value of the capacitors C1 and C2 reduces based on the control signal φ4. Note that, in the above explanation the control signal φ4 is used as a capacitance value control signal for changing the capacitance value of the capacitors C1 and C2. However, the circuit control device 102 may independently generate a capacitance value control signal.

At this time, the electric charge held by the capacitors C1, C2 and C5 reaches an equilibrium state in accordance with the Expression 1 below

[Expression 1]

$$Q = CV \quad \text{(Expression 1)}$$

In Expression 1, Q is electric charge (coulombs), C is the capacitance of the capacitor (farads), and V is voltage (volts). Next, a situation when an equilibrium state of the capacitors C1, C2 and C5 is reached will be explained with reference to FIG. 6.

Figure 10:
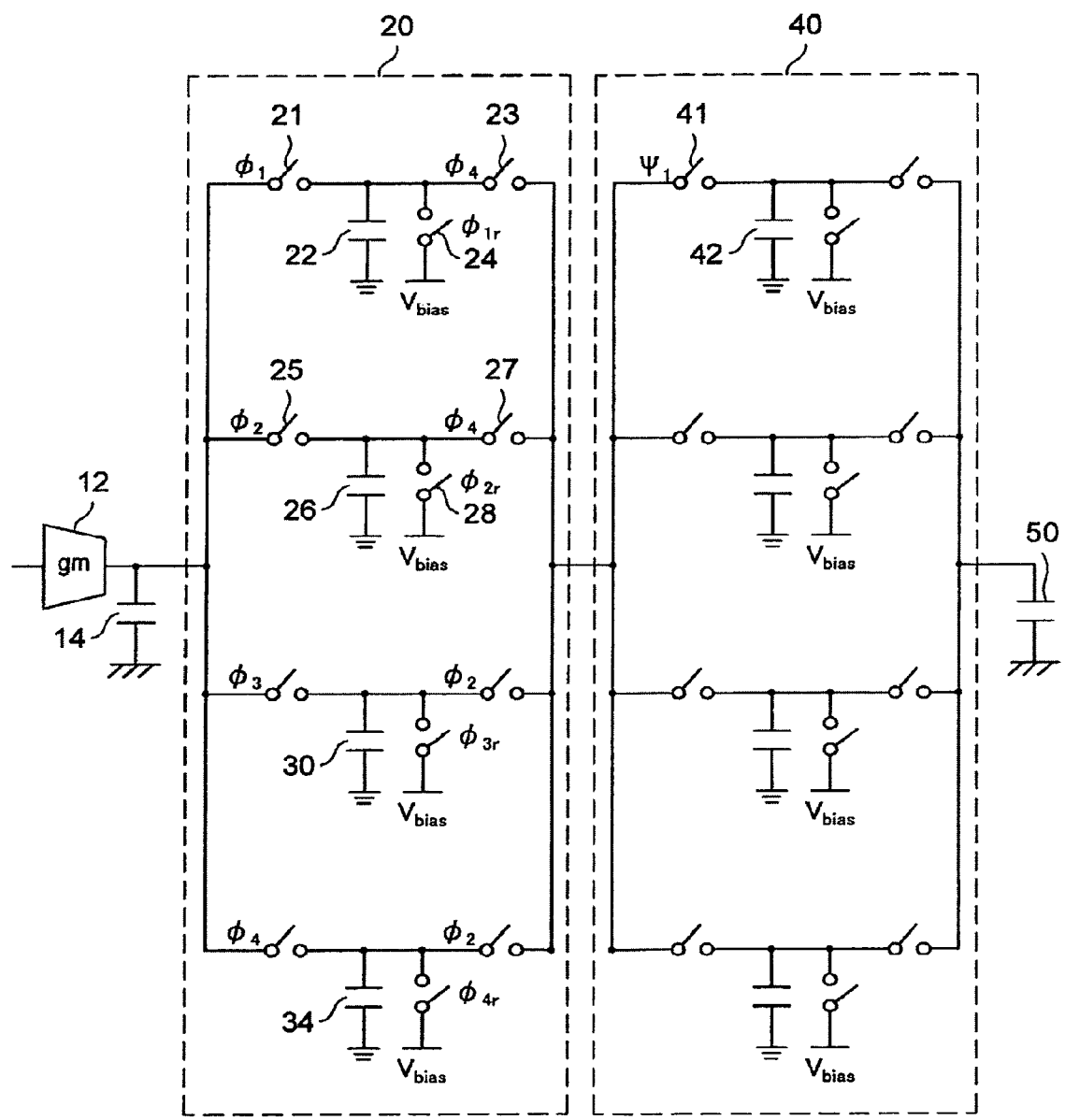
FIG. 10 An explanatory figure that shows the circuit configuration of a charge domain filter circuit related to this application.

FIG. 6 is an explanatory figure that shows the situation where the equilibrium state of the capacitors C1, C2 and C5 of the charge domain filter circuit 110 is reached. FIG. 6(A) shows a circuit state immediately after the capacitors C1, C2 have sampled the current supplied from the transconductor 114. FIG. 6(B) shows a circuit state when the capacitors C1, C2 and C5 have performed charge sharing and reached the equilibrium state. FIG. 6(C) shows a circuit state when the capacitors 22, 26 and 42 of the known charge domain filter circuit 10 explained with reference to FIG. 10 have reached the equilibrium state.

First, let us consider a case in which the capacitors C1 and C2 have the same capacitance value n, and the same electric charge amount x as shown in FIG. 6(A). The capacitor C5 has a capacitance value n, and at this time electric charge is not being stored.

Next, a switch 132 that corresponds to the switches S2, S6 and S17 is closed based on the control signal φ4 and the control signal ψ1, whereby the capacitors C1, C2 and C5 are connected. Furthermore, it can be assumed that the capacitance value of the capacitors C1 and C2 will reduce to n/5 based on the control signal φ4.

At this time, the capacitors C1, C2 and C5 reach an equilibrium state with the same potential. Accordingly, as can be calculated using Expression 1, a state in which 0.28× of electric charge is stored in the capacitors C1 and C2, respectively, and 1.44× of electric charge is stored in the capacitor C5 is the equilibrium state. Thus, the capacitors C1, C2 and C5 reach an equilibrium state of (1.44×/n) V of potential.

On the other hand, in the known method in which the capacitance value of the capacitors C1 and C2 is not changed between the sampling mode and the output mode, as shown in FIG. 6(C), a state in which 0.66× of electric charge is stored in the capacitors 22 and 26, respectively, is the equilibrium state. Thus, the potential of the capacitors 22, 26 and 42 is (0.66×/n) V.

In this manner, in the charge domain filter circuit 110 according to the present embodiment, after charge sharing, it is possible to reduce the electric charge amount remaining in a first capacitor (in the above example, the capacitors C1, and C2) that is an electric charge output source. Alternatively, it is possible to output more electric charge to a second capacitor (in the above example, the capacitor C5) that is an output destination of the electric charge from the first capacitor. Accordingly, the number of stages of charge sampling filter circuit sections connected in the following stages can be increased. Furthermore, as described above, it is possible to promote increase of the potential of each capacitor C in the equilibrium state.

Note that, the ratio at which the capacitance value of the first capacitor is reduced is not limited to ⅕, and may be set to a chosen ratio. In addition, because the capacitor C5 stores electric charge based on the capacitance of the capacitors C1 and C2, it is equivalent to taking the moving average of capacitors C1 and C2. Accordingly, as would be expected, the frequency characteristic of the signal information of the capacitor C5 is similar to the SINC function shown in FIG. 2. In addition, in order to change the given frequency characteristic, methods can be conceived of such as changing the cycle of each control signal φ, the number of capacitors C (taps), or the tap constant (all 1 in the present embodiment). In addition, a configuration may be adopted in which the capacitance value of the first capacitor is reduced during one period in the period when the circuit mode is the output mode.

Returning to the explanation of the operation of the charge domain filter circuit 110, during the period while the control signal φ1r input to the charge domain filter circuit 110 has a high level, the switch S3 is closed, and the circuit mode changes to the discharge mode. Accordingly, the electric charge remaining in the capacitor C1 is discharged. Note that, in the above explanation, according to the charge domain filter circuit 110 of the present embodiment, the electric charge amount remaining in the capacitor C1 is reduced, and thus it is possible to promote improvement in gain as the entire charge domain filter circuit 110. Furthermore, according to the charge domain filter circuit 110 of the present embodiment, it is also possible to suppress the problem of excess signal information being lost.

Furthermore, if the capacitance of the capacitor C1 is kept constantly low, supplied electric charge and discharged electric charge can be reduced, and thus it can be assumed that even greater gain can be obtained. However, since the current is input to the capacitor C1 from the transconductor 114, if the capacitance value is a small fixed capacitance, the voltage generated at the capacitance terminal of the capacitor C1 in the sampling mode is large. As a result, it is possible that signal distortion will increase, causing a significant problem as a filter circuit.

In addition, hypothetically, if it is assumed that there is another charge sampling circuit in the previous stage to the first charge sampling circuit portion 120, and the capacitor C1 is supplied with electric charge by charge sharing with a capacitor of the previous stage, electric charge discharged by the capacitor of the previous stage will increase. As a result, in the case that capacitance of the capacitor C1 is kept constantly low, it is unavoidable that an SN ratio of the input signal will deteriorate. Moreover, in the case that the capacitance of the capacitor C1 is kept constantly low, the influence of parasitic capacitance on the charge domain filter circuit 110 will increase, which may make it impossible to obtain a desired frequency characteristic. From this viewpoint as well, switching the capacitance value of the capacitor C1 as in the present embodiment between the sampling mode and the output mode is effective.

Like the above-described capacitors C1 and C2, the capacitors C3 and C4 perform charge sharing with the capacitor C6 based on the control signal φ2 and the control signal 2. At this time, because the capacitance value of the capacitors C3 and C4 reduces based on the control signal φ2, the electric charge amount remaining in the capacitors C3 and C4 after charge sharing can be reduced. Note that, the electric charge of the capacitor C3 is discharged based on the control signal φ3r, and the electric charge of the capacitor C4 is discharged based on the control signal φ4r.

Like the above-described capacitors C1 and C2, the capacitors C5 and C6 perform charge sharing with the output capacitor 170 based on the control signal ψ4. At this time, because the capacitance value of the capacitors C5 and C6 reduces based on the control signal ψ4, the electric charge amount remaining in the capacitors C5 and C6 after charge sharing can be reduced. Note that, the electric charge of the capacitor C5 is discharged based on the control signal ψ1r, and the electric charge of the capacitor C6 is discharged based on the control signal ψ2r. Here, the capacitors C5 and C6 function as a first capacitor, and the output capacitor 170 functions as a second capacitor.

Like the above-described capacitors C5 and C6, the capacitors C7 and C8 perform charge sharing with the output capacitor 170 based on the control signal ψ2. At this time, because the capacitance value of the capacitors C7 and C8 reduces based on the control signal ψ2, the electric charge amount remaining in the capacitors C7 and C8 after charge sharing can be reduced. Note that, the electric charge of the capacitor C7 is discharged based on the control signal ψ3r, and the electric charge of the capacitor C8 is discharged based on the control signal ψ4r. Here, the capacitors C7 and C8 function as the first capacitor, and the output capacitor 170 functions as the second capacitor.

Figure 7:
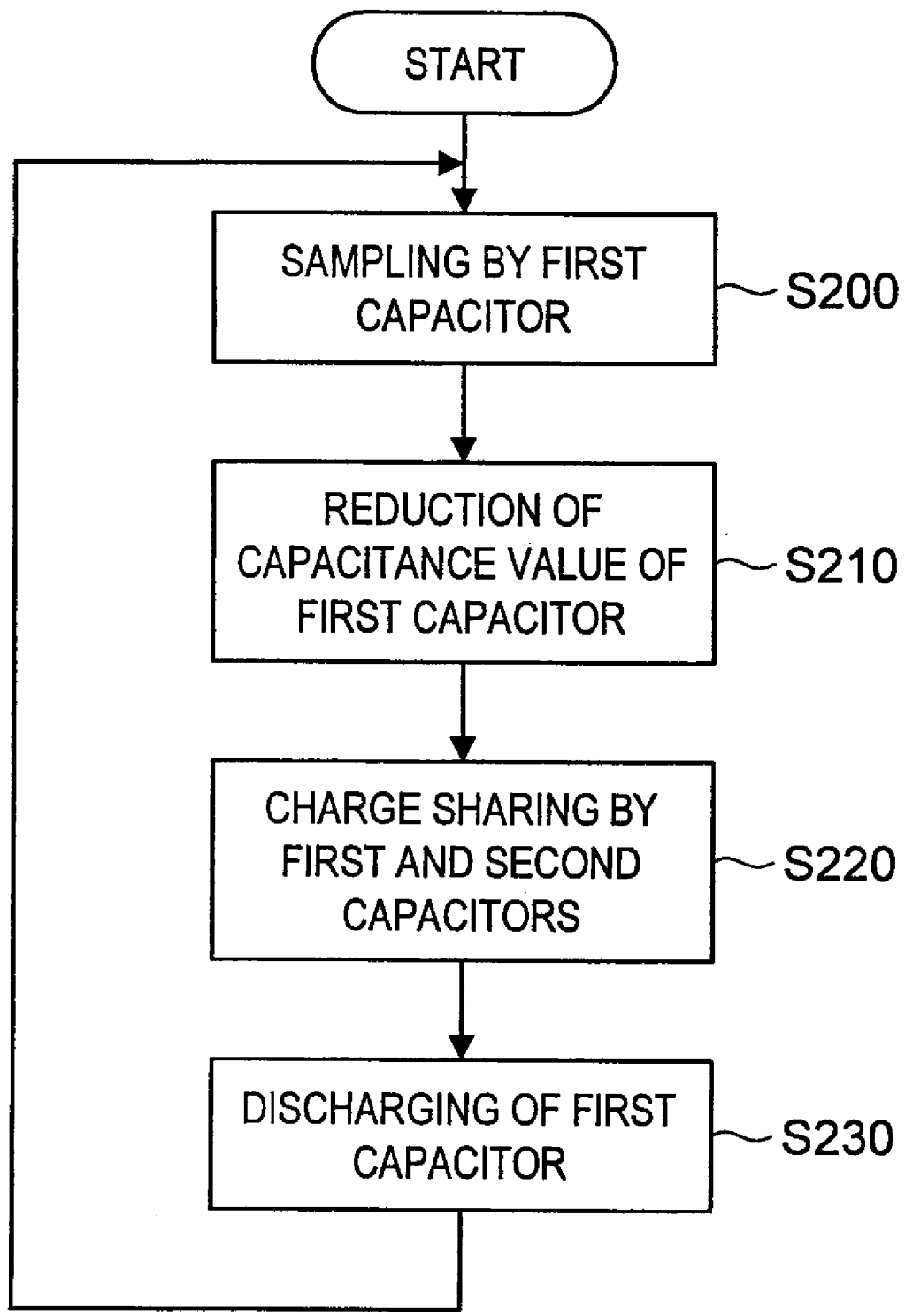
FIG. 7 A flow chart that shows the operation of the charge domain filter circuit according to the same embodiment.

Hereinabove, the operation of the charge domain filter circuit 110 according to the present embodiment has been explained. The method used to perform this operation of the charge domain filter circuit 110 can be summarized as shown in FIG. 7. First, the first capacitor samples the input signal (S200). Then, the first capacitor reduces its capacitance value to lower than when sampling was performed, based on the input capacitance value control signal (S210).

Following this, the first capacitor performs charge sharing with the second capacitor in the following stage, and at least some of the electric charge stored by the above-described sampling is output to the second capacitor in the following stage (S220). Note that, the number of first capacitors is not limited to one, and a plurality may be used. Next, the first capacitor discharges electric charge remaining in the first capacitor (S230). As a result of repeating the operation shown in the described S200 to S230, the charge domain filter circuit 110 can output the signal with the frequency characteristic shown in FIG. 2 while reducing electric charge discharged from the first capacitor.

In addition, because the capacitors that configure the charge domain filter circuit 110 have a variable capacitance, as described in the present embodiment, it is possible to selectively vary or fix the capacitance value of each capacitor. For example, in the charge domain filter circuit 110, the control signal applied to the capacitor as the variable capacitance of the charge sampling circuit portion 120 may be set as a GND signal, thereby inhibiting the variable capacity operation of the capacitors that configure the charge sampling circuit portion 120, and allowing the signal gain of the charge sampling circuit portion 120 to be reduced.

Similarly, by selecting whether variable capacitance or fixed capacitance is used for each capacitor, it is possible to attribute a rough gain adjustment function to the charge domain filter circuit 110. By suitably performing selection in accordance with the usage, objective or the like of the charge domain filter circuit 110, the signal level in the charge domain filter circuit 110 when large signals are being input can be adjusted, thereby allowing a substantial reduction in signal distortion caused by saturation of the voltage in the circuit. The above-described configuration is an extremely important feature from the point of view of usage of the same filter circuit in radio devices. Because the configuration does not need separately attribute excessive linearity to a VGA circuit or the filter circuit etc., it is possible to achieve a substantial reduction in electric power consumption.

In addition, in order to obtain this type of effect, a method could be conceived of in which a plurality of capacitors with different capacitance values are provided, and the used capacitor among the plurality of capacitors is selected using a switching operation. As compared to this method, the method using variable capacitance according to the present embodiment is favorable in that the number of capacitors required by the charge domain filter circuit 110 can be reduced.

Next, one example of the detailed configuration of the capacitors C1, C2, C3, C4, C5, C6, C7 and C8 will be explained using the example of the capacitor C1 while referring to FIG. 8.

FIG. 8 is a schematic figure that shows the configuration of the capacitor C1 of the charge domain filter circuit 110. FIG. 8(a) shows the state of the capacitor C1 in the sampling mode, and FIG. 8(b) shows the state of the capacitor C1 in the output mode.

As shown in FIG. 8(a), the capacitor C1 may be configured by, for example, an n-type MOS. In the sampling mode, the switch S1 is closed, and current from the transconductor 114 is supplied to the gate of the n-type MOS. At this time, the n-type MOS is switched to an inverted state, and an inversion layer is formed under the gate oxide film. Accordingly, in the sampling mode, the capacitance value of the n-type MOS becomes larger.

On the other hand, as shown in FIG. 8(b), in the output mode, the switch S1 is open, and the switch S2 is closed, and thus the switch S4 is switched to connect Vdd and the source and the drain. At this time, as a result of the source and the drain being connected with Vdd, the inversion layer disappears, and the capacitance value of the n-type MOS reduces. According to the above-described configuration, the capacitance value of the capacitor C1 can be varied between the sampling mode and the output mode. Note that, it is sufficient f if the capacitance value of the capacitor C1 can be varied, and thus, for example, a variable capacitance diode with a capacitance value that reflects changes in the width of a depletion layer may be used.

Next, a modified example of the control signal input to the charge domain filter circuit 110 from the circuit control device 102 will be explained with reference to FIG. 9.

Figure 9:
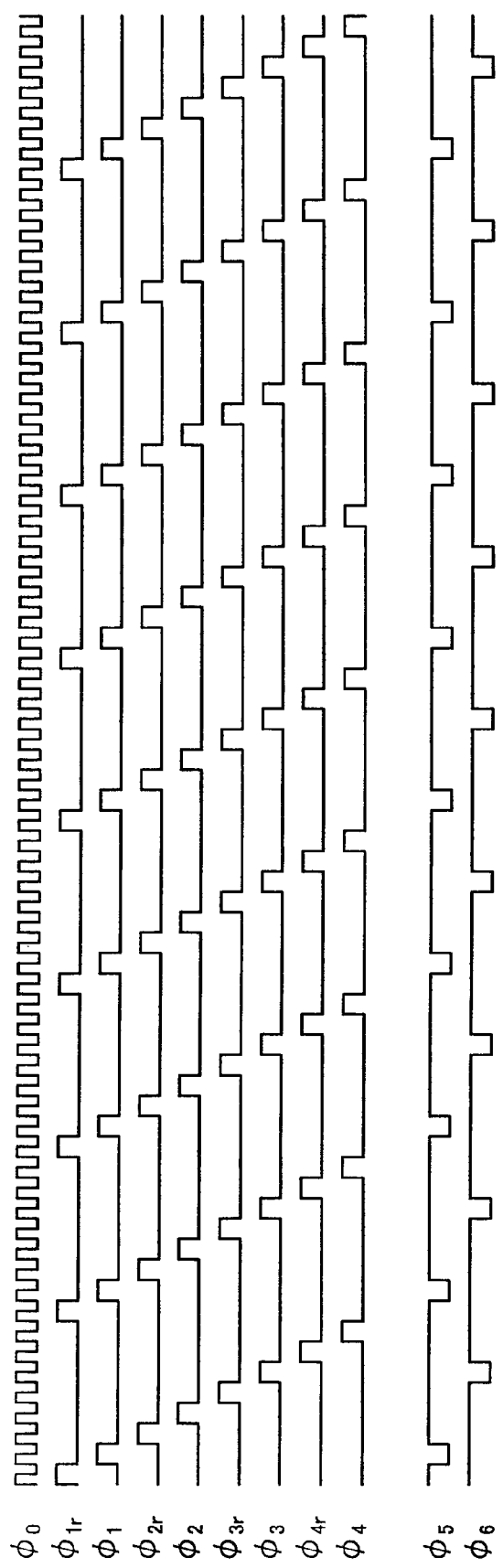
FIG. 9 An explanatory figure that shows another example of a control signal input to the charge domain filter circuit.

FIG. 9 is an explanatory figure that shows another example of a control signal input to the charge domain filter circuit 110. In the modified example, the charge domain filter circuit 110 is configured such that the control signals φ5 and φ6 as the capacitance value control signal that controls the capacitance value of the capacitors C1 and C3 are input independently from the mode switching signal.

In the above configuration, the capacitance value of the capacitor C1 is reduced while the control signal φ5 input to the charge domain filter circuit 110 has a high level, and the capacitance value of the capacitor C3 is reduced while the control signal φ6 input to the charge domain filter circuit 110 has a high level.

Here, the control signal φ5 may be held at the high level throughout a specified period that includes the period of the output mode in which the control signal φ4 changes to the high level. In the example shown in FIG. 9, the control signal φ5 is set to be held at the high level with the exception of the period of the sampling mode when the control signal φ1 has a high level. In other words, FIG. 9 shows a case in which the specified period includes a period in which the circuit mode is the discharge mode. In the above configuration, the capacitance value of the capacitor C1 also reduces during the discharge mode.

As a result, first, it is possible to reduce error component of the signal output from the capacitor C1 during the output mode. Hypothetically, if the control signal shown in FIG. 3 is input to the charge domain filter circuit 110, first, when the capacitance value of the capacitor C1 is large, the terminal voltage is initialized by Vbias. Next, when the capacitance value is large, the capacitor C1 samples or charges the input signal. Following this, along with the shift to the output mode, the capacitance value of the capacitor C1 changes from large to small.

Here, a DC level of the terminal voltage that becomes the output voltage of the capacitor C1 shows variation regardless of the presence or absence of an input signal as a result of characteristics of the element (for example, MOS) used for configuring the capacitor C1, ambient temperature, the size of the power supply voltage etc. The above variation of the DC level becomes error component for a desired signal component. Accordingly, from a practical standpoint, it is important to remove this variation of the DC component from the output signal.

In order to reduce the above error component, concretely, as shown in FIG. 9, the value of the capacitor C1 in the discharge mode is set to a small value. In other words, the capacitor C1 can be set to Vbias after setting the circuit state to that in the output mode. According to the above configuration, because the capacitor C1 charges the input signal after the initial value of the electric charge is set by Vbias, the given input signal becomes equivalent to the difference with respect to the above variation of the DC level of the output mode, and thus the error component can be reduced.

Second, because the capacitance value of the capacitor C1 is reduced in the discharge mode as well, the capacitance drive required when discharging the capacitor C1 and initializing (resetting) can be reduced. In other words, because the capacitance drive is generated based on a reference voltage source connected after Vbias is connected, it is possible to use an economical, low energy consumption reference voltage generating circuit. In addition, the capacitance value of the capacitor C1 is not reduced during the period of the output mode, and thus the problem of not obtaining a desired equilibrium state can be suppressed. Furthermore, the configuration is favorable in that the control signal φ5 can be generated just by passing the control signal φ1 through an inverter.

Like the control signal φ5, the control signal φ6 may be held at the high level throughout the specified period including the period of the output mode in which the control signal φ2 changes to the high level. In the example shown in FIG. 9, the control signal φ6 is set to be held at the high level with the exception of the period of the sampling mode when the control signal φ3 has a high level. In the above configuration, the capacitance value of the capacitor C1 also reduces during the discharge mode, and the voltage is in an increasing state. Accordingly, in a similar manner to above, direct current component of the signal output from the capacitor C1 in the output mode can be reduced, and an economical, low energy consumption reference voltage generating circuit can be used.

Moreover, a configuration may be adopted in which the voltage level of the control signals φ5 and φ6 is changed to appropriately adjust the extent of reduction of the capacitance value of each capacitor C.

In addition, it is sufficient that the capacitance value of the capacitor C in the output mode is lower than the capacitance value in the sampling mode, and the capacitance value in the sampling mode may also be appropriately changed. Thus, in accordance with the usage and objective of the charge domain filter circuit 110, the capacitance value of the capacitor C may be changed other than during the period of the output mode to increase or decrease gain of the charge domain filter circuit 110.

Like the control signals φ5 and φ6, the control signals that effect the other capacitors C2, C4, C5, C6, C7 and C8 may be generated independently from the mode switching signal, and set such that the capacitance value of each capacitor C is reduced during the specified period that includes the period in which the circuit mode corresponding to each capacitor C is the output mode.

As explained above, according to the charge domain filter circuit 110 of the present embodiment, when charge sharing is performed, the capacitance value of the capacitor C on the side that supplies electric charge can be reduced to reduce the electric charge remaining in the capacitor C on the side that is supplied with electric charge. As a result, after charge sharing, the electric charge amount discharged from the capacitor C on the side that supplied electric charge is also reduced, thereby promoting improvement of gain as the entire charge domain filter circuit 110.

Moreover, because the charge domain filter circuit 110 can supply more electric charge to the following stage as compared to the known technology, it is possible, for example, to arrange a circuit having a complicated frequency characteristic in the following stage. Thus, it is possible to markedly increase the degree of freedom of designing the circuit configuration.

Furthermore, the mode switching signal that instructs the circuit mode of the charge domain filter circuit 110 to be switched to the output mode can also be made to function as the capacitance value control signal that reduces the capacitance value of the capacitor C on the side that supplies electric charge when charge sharing is performed. In other words, the capacitance value control signal can be set with the same phase as the mode switching signal that instructs the circuit mode of the charge domain filter circuit 110 to switch to the output mode. As a result, the process of generating the capacitance value control signal can be omitted, thereby promoting simplification of the processing process and cost reduction.

Moreover, if the capacitance values of the capacitor C in the output mode and the discharge mode are set to be the same, the direct current component of the signal output from the capacitor C1 in the output mode is reduced, and in addition, the economical, low energy consumption reference voltage generating circuit can be used.

Second Embodiment

As described above, according to the charge domain filter circuit 110 of the first embodiment, after charge sharing, the electric charge amount discharged from the capacitor C on the side that supplied electric charge is reduced, and thus it is possible to promote improvement in gain as the entire charge domain filter circuit 110. However, in the case that a high level signal is input to the charge domain filter circuit 110 or the like, it can be assumed that there are situations when a reduction in gain of the charge domain filter circuit 110 is desired.

Given this, and in light of the above circumstances, a charge domain filter circuit 111 according to a second embodiment has been created. According to the charge domain filter circuit 111 of this embodiment, signal component of the signal input to the charge domain filter circuit 111 can be attenuated as necessary. Hereinafter, the charge domain filter circuit 111 will be explained in detail with reference to FIG. 11 to FIG. 16.

Figure 11:
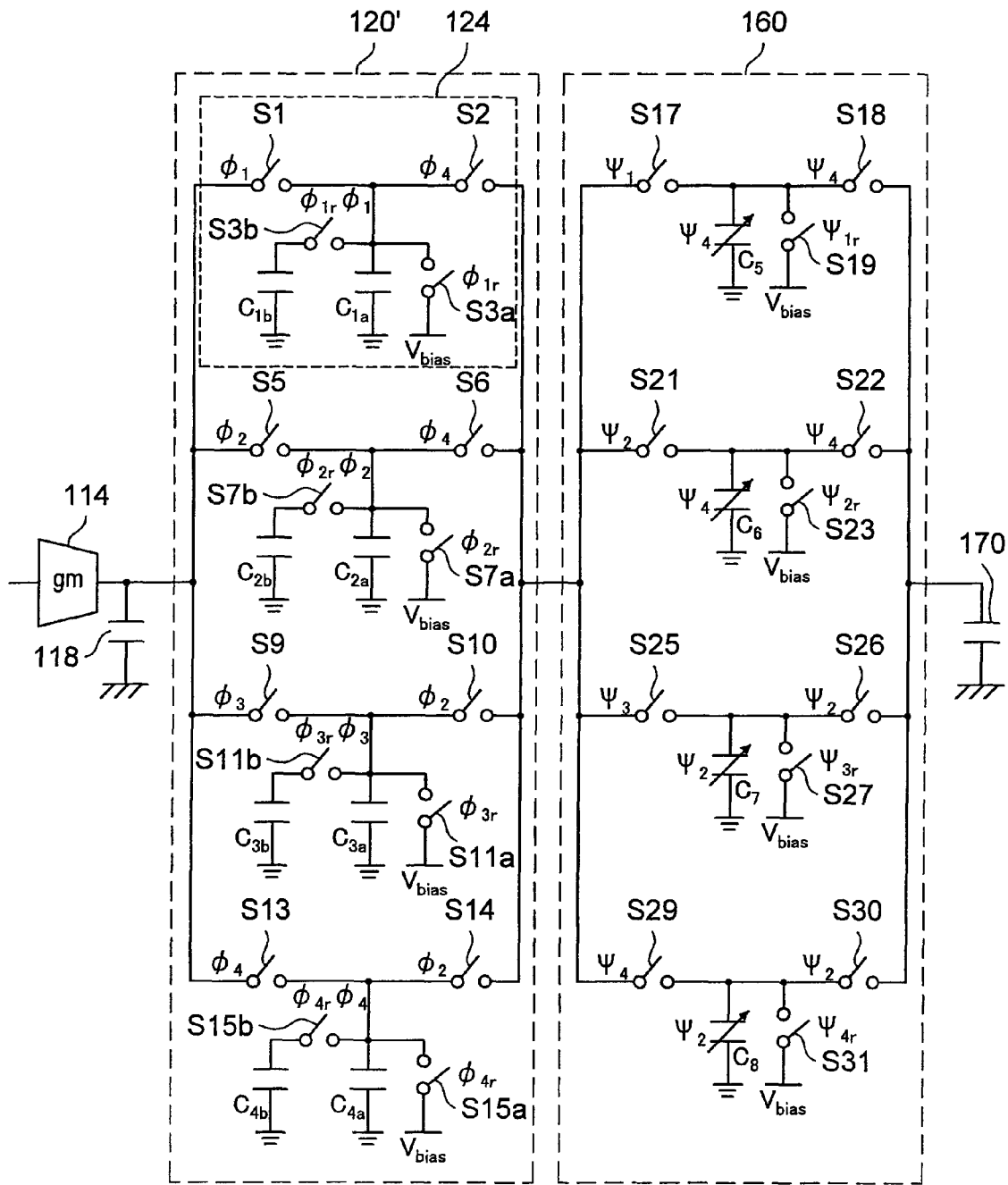
FIG. 11 An explanatory figure that shows the circuit configuration of a charge domain filter circuit according to a second embodiment of the present invention.

FIG. 11 is an explanatory figure that shows a circuit configuration of the charge domain filter circuit 111 of the present embodiment. As shown in FIG. 11, the transconductor (gm) 114, the IIR capacitor 118, a first charge sampling circuit portion 120', the second charge sampling circuit portion 160, and the output capacitor 170 on the inside or outside are provided. In addition, the charge domain filter circuit 111 is input with the control signal shown in FIG. 3.

The first charge sampling circuit portion 120' is provided with an attenuation function portion 124 that includes a unit capacitor group including capacitors C1a and C1b, and switches S1, S2, S3a and S3b as a second switching portion that switches the circuit mode of the unit capacitor group. In addition, the first charge sampling circuit portion 120' is provided with a unit capacitor group including capacitors C2a and C2b, a unit capacitor group including capacitors C3a and C3b, and a unit capacitor group including capacitors C4a and C4b. Furthermore, the first charge sampling circuit portion 120' is provided with switches S5, S6, S7a, S7b, S9, S10, S11a, S11b, S13, S14, S15a and S15b that switch the circuit mode of each of the above-described unit capacitor groups.

The switch S1 is a switch that connects or disconnects the unit capacitor group including the capacitors C1a and C1b and the transconductor 114. The φ1 written to the side of the switch S1 indicates that, while the control signal φ1 input to the charge domain filter circuit 111 has a high level, the switch S1 is closed and the unit capacitor group including the capacitors C1a and C1b and the transconductor 114 are connected. In other words, φ1 functions as the mode switching signal that switches the circuit mode of at least a section of the charge domain filter circuit 111. The control signals φ2 to φ4, the control signals φ1r to φ4r, the control signals ψ1 to ψ4, and the control signals ψ1r to ψ4r similarly function as the mode switching signals.

The switch S2 is a switch that connects or disconnects the unit capacitor group including the capacitors C1a and C1b, the unit capacitor group including the capacitors C2a and C2b, and the capacitor C5 or C7 of the second charge sampling circuit portion 160. The φ4 written to the side of the switch S2 indicates that, while the control signal φ4 input to the charge domain filter circuit 111 has a high level, the switch S2 is closed, and the unit capacitor group including the capacitors C1a and C1b, the unit capacitor group including the capacitors C2a and C2b, and the capacitor C5 or C7 of the second charge sampling circuit portion 160 are connected.

The switch S3a is a switch that connects or disconnects the capacitor C1a with Vbias. The φ1r written to the side of the switch S3a indicates that, while the control signal φ1r input to the charge domain filter circuit 111 has a high level, the switch S3 is closed and the capacitor C1a is connected with Vbias.

The switch S3b is a switch that connects or disconnects the capacitor C1b with the transconductor 114. In addition, the switch S3b is a switch that connects or disconnects the capacitor C1b with Vbias. The φ1r written to the side of the switch S3b indicates that, while the control signals φ1r and φ1 input to the charge domain filter circuit 111 have a high level, the switch S3 is closed. Accordingly, while the control signal φ1 has a high level, the capacitor C1b is connected with the transconductor 114, and while the control signal φ1r has a high level, the capacitor C1b is connected with Vbias.

Like the switch S1, the switch S5 is a switch that connects or disconnects the unit capacitor group including the capacitors C2a and C2b and the transconductor 114 based on the control signal φ2, the switch S9 is a switch that connects or disconnects the unit capacitor group including the capacitors C3a and C3b and the transconductor 114 based on the control signal φ3, and the switch S13 is a switch that connects or disconnects the unit capacitor group including the capacitors C4a and C4b and the transconductor 114 based on the control signal φ4.

Like the switch S2, the switch S6 is a switch that connects or disconnects the unit capacitor group including the capacitors C1a and C1b, the unit capacitor group including the capacitors C2a and C2b, and the capacitor C5 or C7 of the second charge sampling circuit portion 160 based on the control signal φ4, the switch S10 is a switch that connects or disconnects the unit capacitor group including the capacitors C3a and C3b, the unit capacitor group including the capacitors C4a and C4b, and the capacitor C6 or C8 of the second charge sampling circuit portion 160 based on the control signal φ2, and the switch S14 is a switch that connects or disconnects the unit capacitor group including the capacitors C3a and C3b, the unit capacitor group including the capacitors C4a and C4b, and the capacitor C6 or C8 of the second charge sampling circuit portion 160 based on the control signal φ2.

Like the switch S3a, the switch S7a is a switch that connects or disconnects the capacitor C2a with Vbias based on the control signal φ2r, the switch S11a is a switch that connects or disconnects the capacitor C3a with Vbias based on the control signal φ3r, and the switch S15a is a switch that connects or disconnects the capacitor C4a with Vbias based on the control signal φ4r.

Like the switch S3b, the switch S7b is a switch that connects the capacitor C2b with the transconductor 114 while the control signal φ2 has a high level, and connects the capacitor C2b with Vbias while the control signal φ2r has a high level. Moreover, the switch S11b is a switch that connects the capacitor C3b with the transconductor 114 while the control signal φ3 has a high level, and connects the capacitor C3b with Vbias while the control signal φ3r has a high level. Furthermore, the switch S15b is a switch that connects the capacitor C4b with the transconductor 114 while the control signal φ4 has a high level, and connects the capacitor C4b with Vbias while the control signal φ4r has a high level.

Next, the operation of the charge domain filter circuit 111 will be explained while focusing attention on the attenuation function portion 124. First, when the control signal φ1 input to the charge domain filter circuit 111 has a high level, the switches S1 and S3b are closed, and the circuit mode of the attenuation function portion 124 (the circuit section that corresponds to the unit capacitor group including the capacitors C1a and C1b) becomes the sampling mode. In other words, the transconductor 114 and the capacitors C1a and C1b are connected.

When the circuit mode of the attenuation function portion 124 switches to the sampling mode, the capacitors C1a and C1b sample the current as the input signal supplied from the transconductor 114 until a time t elapses from when the control signal φ1 input to the charge domain filter circuit 111 has changed to a high level. In other words, the current supplied from the transconductor 114 is sampled by Windowed Integration Sampling or rectangular sampling.

Next, when the control signal φ2 input to the charge domain filter circuit 111 changes to a high level, the switches S5 and S7b are closed and the circuit mode of the unit capacitor group including the capacitors C2a and C2b switches to the sampling mode. In other words, the transconductor 114 and the capacitors C2a and C2b are connected. Accordingly, the capacitors C2a and C2b sample the current supplied from the transconductor 114 until a time t elapses from when the control signal φ2 input to the charge domain filter circuit 111 has changed to the high level. Note that, during the period when the control signal φ3 input to the charge domain filter circuit 111 has a high level, the circuit mode of the unit capacitor group including the capacitors C1a and C1b and the unit capacitor group including the capacitors C2a and C2b is a maintaining mode that maintains the immediately previous charge state.

Furthermore, when the control signal φ4 and the control signal ψ1 input to the charge domain filter circuit 111 change to a high level, the switches S2, S6 and S17 are closed, and the circuit mode of the unit capacitor group including the capacitors C1a and C1b and the unit capacitor group including the capacitors C2a and C2b changes to the output mode.

In the above output mode, the capacitor C1a, the capacitor C2a, and the capacitor C5 are connected, but because the switches S3b and S7b are open, the capacitor C1b and the capacitor C2b are not connected. Accordingly, only the electric charge charged in the capacitor C1a and the capacitor C2a is output to the capacitor C5 by charge sharing, and the electric charge charged in the capacitor C1b and the capacitor C2b is not output.

In this manner, in the first charge sampling circuit portion 120', different unit capacitor groups successively sample the input signal, and electric charge stored by sampling by one or two or more unit capacitor groups is successively output to the following stage. In addition, the attenuation function portion 124 samples the input signals by the plurality of capacitors that configure the unit capacitor groups while outputting from just one of the plurality of capacitors. As a result, the attenuation function portion 124 can attenuate the input signal and output it.

In addition, when the control signal φ1r input to the charge domain filter circuit 111 changes to the high level, the switch S3a is closed, and the circuit mode of the unit capacitor group including the capacitors C1a and C1b changes to the discharge mode. In other words, electric charge remaining in the capacitors C1a and C1b is discharged via the switch S3a.

Hereinabove, the operation of the first charge sampling circuit portion 120' has been explained while focusing on the attenuation function portion 124. Note that, the unit capacitor group including the capacitors C2a and C2b and the switches S5 to S7a, b, the unit capacitor group including the capacitors C3a and C3b and the switches S9 to S11a, b, and the unit capacitor group including the capacitors C4a and C4b and the switches S13 to S15a, b also operate in the same manner.

Figure 12:
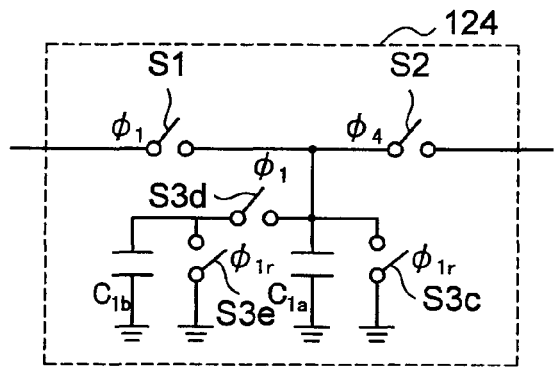
FIG. 12 An explanatory figure that shows a first modified example of a circuit configuration of an attenuation function portion.
Figure 13:
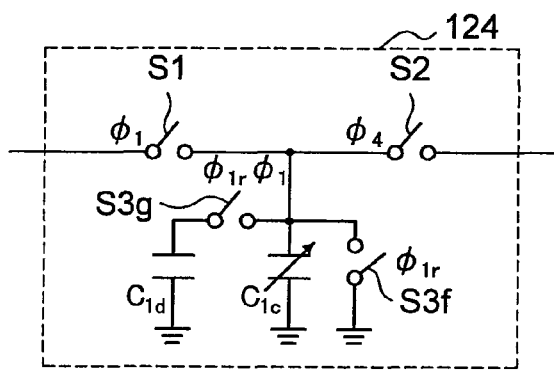
FIG. 13 An explanatory figure that shows a second modified example of a circuit configuration of the attenuation function portion.
Figure 14:
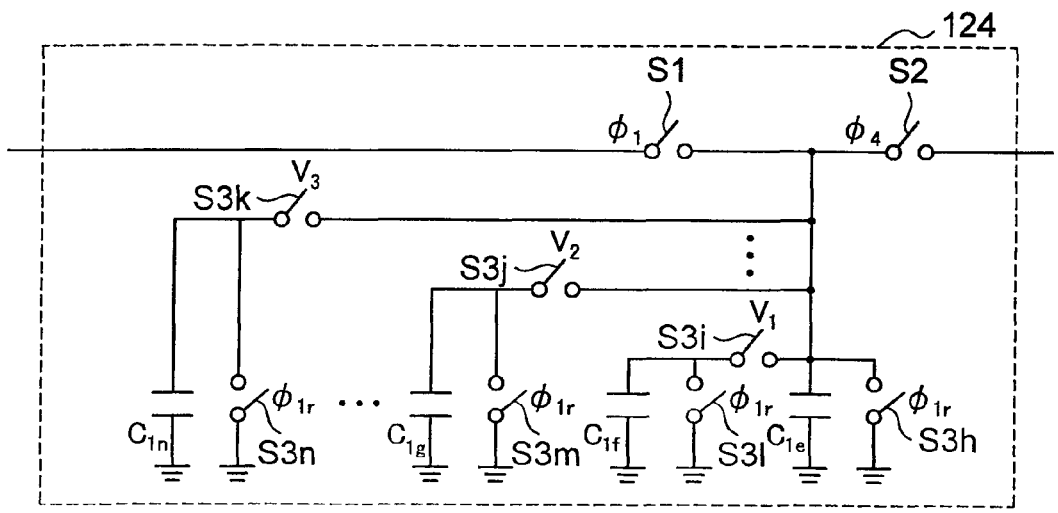
FIG. 14 An explanatory figure that shows a third modified example of a circuit configuration of the attenuation function portion.

Note that, the circuit configuration of the attenuation function portion 124 shown in FIG. 11 is merely one example, and, for example, the attenuation function portion 124 may adopt the circuit configuration shown in FIG. 12 to FIG. 14.

FIG. 12 is an explanatory figure of a first modified example of the circuit configuration of the attenuation function portion 124. The attenuation function portion 124 according to the first modified example includes the switches S1, S2, S3c, S3d and S3e as the second switching portion, and the capacitors C1a and C1b.

In the attenuation function portion 124 according to the first modified example, during the period when the control signal φ1 has a high level, the switches S1 and S3d are closed, and the circuit mode of the attenuation function portion 124 changes to the sampling mode. In other words, the input signal is sampled by the capacitors C1a and C1b.

Next, during the period when the control signal φ4 has a high level, the switch S2 is closed, and the circuit mode of the attenuation function portion 124 changes to the output mode. In other words, the capacitor C1a and the capacitor C5 (and the capacitor C2a) are connected, and electric charge stored in the capacitor C1a in the sampling mode is output to the capacitor C5. On the other hand, because the switch S3d is open, electric charge stored in the capacitor C1b in the sampling mode is not output.

In addition, during the period when the control signal φ1r has a high level, the switches S3c and S3e are closed, and the circuit mode of the attenuation function portion 124 changes to the discharge mode. In other words, the electric charge remaining in the capacitor C1a is discharged via the switch S3c, and the electric charge remaining in the capacitor C1b is discharged via the switch S3e.

The attenuation function portion 124 according to the above first modified example, like the circuit configuration shown in FIG. 11, can sample the input signal by the plurality of capacitors while outputting from just a portion of the plurality of capacitors. As a result, signal component can be attenuated.

FIG. 13 is an explanatory figure that shows a second modified example of the circuit configuration of the attenuation function portion 124. The attenuation function portion 124 according to the second modified example, as shown in FIG. 13, includes the switches S1, S2, S3f and S3g as the second switching portion, and the capacitors C1c and C1d.

The circuit configuration of the attenuation function portion 124 according to the second modified example is different from the circuit configuration shown in FIG. 11 in that the capacitor C1c is a variable capacitor. In the attenuation function portion 124 according to the second modified example, the capacitance value of the capacitor C1c during the sampling mode, for example, may be reduced as compared to the capacitance value of the capacitor C1c during the output mode.

According to the above configuration, the output of electric charge to the capacitor C5 from the capacitor C1c during the output mode can be reduced still further. In other words, the attenuation function portion 124 can further attenuate the input signal component. Note that, in the case that the capacitor C1c that is the variable capacitor is provided in the attenuation function portion 124, it is not essential to connect the other capacitor C1d in parallel.

FIG. 14 is an explanatory figure that shows the circuit configuration of the attenuation function portion 124 of the third modified example. The attenuation function portion 124 according to the third modified example includes S1, S2 and S3h to S3n as the second switching portion, and a unit capacitor group including capacitors C1e, C1f, C1g and C1n.

In the attenuation function portion 124 according to the third modified example, during the period when the control signal φ1 has a high level, the switch S1 is closed, the circuit mode of the attenuation function portion 124 changes to the sampling mode, and sampling is performed using just a capacitor selected from the unit capacitor group. The selection method for the capacitor that performs sampling will be explained with reference to FIG. 15 and FIG. 16.

Figure 15:
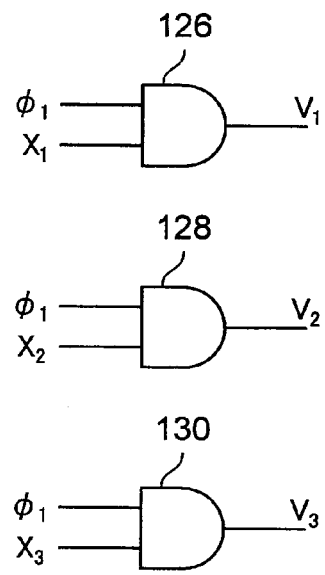
FIG. 15 An explanatory figure that shows a control signal generation method.
Figure 16:
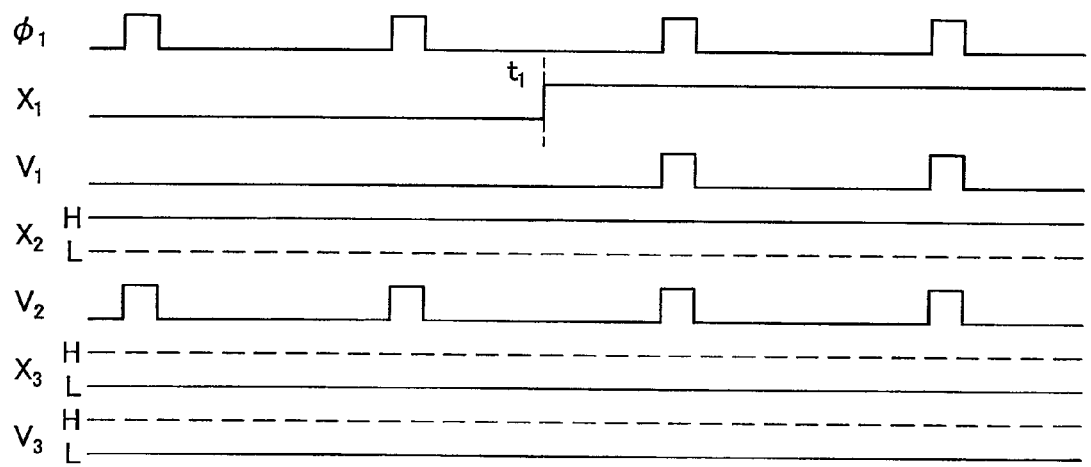
FIG. 16 An explanatory figure that shows the relationship between selection signals and the control signals.

FIG. 15 is an explanatory figure that shows a generation method of control signals V1 to V3. FIG. 16 is an explanatory figure that shows the relationship of selection signals X1 to X3 and the control signals V1 to V3.

As can be seen from FIG. 15, a logical product calculation portion 126 calculates, when the control signal φ1 and the selection signal X1 are input, the logical product of the control signal φ1 and the selection signal X1, and outputs the control signal V1.

As shown in the third view of FIG. 16, the control signal V1 has a low level during the period when the selection signal X1 has a low level, and has the same wave form as the control signal φ1 during the period when the selection signal has a high level after timing t1. The above control signal V1 is input to the switch S3$i$, and during the period when the control signal V1 has a high level, the switch S3$i$ is closed. Accordingly, the capacitor C1$f$ samples the signal via the switches S1 and S3$i$ in the sampling mode when the control signal φ1 has a high level.

Similarly, as shown in FIG. 15, a logical product calculation portion 128 calculates, when the control signal φ1 and the selection signal X2 are input, the logical product of the control signal φ1 and the selection signal X2, and outputs the control signal V2. As shown in the fifth view of FIG. 16, during the period when the selection signal X2 has a high level, the control signal V2 has the same wave form as the control signal φ1. The above control signal V2 is input to the switch S3$j$, and during the period when the control signal V2 has a high level, the switch S3$j$ is closed. Accordingly, the capacitor C1$g$ samples the signal via the switches S1 and S3$j$ in the sampling mode when the control signal φ1 has a high level.

Furthermore, as shown in FIG. 15 and FIG. 16, when the selection signal X3 has a low level, the control signal V3 input to S3$k$ has a low level, and an open state of S3$k$ is maintained. As a result, the capacitor C1$n$ does not sample the signal even in the sampling mode. In this manner, the selection signals X1 to X3 have a function that selects the capacitor to be activated among the unit capacitor group in the sampling mode.

Note that, returning to the explanation of the attenuation function portion 124 according to the third modified example and referring to FIG. 14, during the period when the control signal φ4 has a high level, the switch S2 is closed, and the electric charge charged in the capacitor C1$e$ is output to the capacitor C5. On the other hand, even if capacitors other than the capacitor C1$e$ of the unit capacitor group are used to performed sampling in the sampling mode, the electric charge obtained by sampling is not output to the capacitor C5, and is discharged while the control signal φ1$r$ has a high level.

Accordingly, to the extent that the number of capacitors in the unit capacitor group used in sampling in the sampling mode is large, namely, to the extent that there are more selection signals X that have a high level (in the case that the capacitance value of each capacitor is the same), the attenuation function portion 124 can reduce the electric charge output in the output mode. Note that, the control signal generation portion 108 may generate the selection signals X1 to X3 based on the signal level of the input signal, the output signal or the like of the charge domain filter circuit 111. For example, in the case that the signal level of the input signal or the output signal is excessive, the control signal generation portion 108 can set more of the selection signals X to have a high level, thereby making it possible for the attenuation function portion 124 to further attenuate signal component.

Note that, the above explanation describes a case in which electric charge is just output from the capacitor C1$e$ during the output mode. However, electric charge may be discharged from a plurality of the capacitors. For example, in the case that the unit capacitor group includes four capacitors, three of the capacitors may be used in sampling, and two of the capacitors used in sampling may be used to output electric charge. According to this configuration, the attenuation amount of the signal component caused by the attenuation function portion 124 can be more finely adjusted.

Hereinabove, favorable embodiments of the present invention have been explained with reference to the appended drawings. However, as will be readily apparent, the present invention is not limited to the given examples. It is obvious that a person skilled in the art will be capable of devising various modified forms and adapted examples within the scope detailed in the claims. It is assumed to be obvious that such modified forms and adapted examples fall within the technical scope of the present invention.

For example, in the above-described first embodiment, an example is described in which the capacitance values of all of the capacitors C that configure the charge domain filter circuit 110 are variable. However, the present invention is not limited to this example. For example, the capacitance values of just some of the capacitor C may be variable.

In addition, the number of the capacitor C of the charge sampling circuit portion of the following stage, and the capacitor C of the charge sampling circuit portion of the previous stage is not limited to two. In other words, the decimation level is not limited to ½, and may have a chosen level such as ⅓, ⅕, or the like. Furthermore, in the case that six capacitors C are provided in one charge sampling circuit portion, for example, it is possible to change decimation simply by changing whether charge filtering is performed using, two capacitors C in the charge sampling circuit portion of the previous stage and one capacitor C in the charge sampling circuit portion of the following stage, or three capacitors C of the charge sampling circuit portion of the previous stage and one capacitor C of the charge sampling filter circuit of the following stage.

Moreover, a computer program that causes an information processing device to function as the above-described circuit control device, and a storage medium that stores the computer program can also be provided. The storage medium, for example, may be a non-volatile memory, an magnetic disk like a hard disk or a floppy disk (registered trademark), or an optical disc like a CD-R (Compact Disk Recordable)/RW (ReWritable), DVD-R (Digital Versatile Disk Recordable)/RW/+R/+RW/RAM (Random Access Memory) and BD (Blu-Ray Disc (registered trademark))-R/BD-RE or the like.

In addition, each step in the charge domain filter circuit 110 of the present specification does not necessarily have to be performed successively in the time series detailed in the flow chart, and may be performed in parallel or individually (for example, parallel processing or object based processing). For example, it is possible to perform in parallel S210 that reduces the capacitance value of the first capacitor and S220 that performs charge sharing of the first capacitor and the second capacitor.

In addition, although in the described example each switch S is closed during the period while the corresponding control signal has a high level, this example is not limiting, and each switch S may be closed during the period when the control signal has a low level. Furthermore, the capacitor C may be configured such that, instead of the capacitance value being reduced during the period when the capacitance value control signal is input, the capacitance value is increased during the period when the capacitance value control signal is input.

In addition, in the second embodiment, a case is explained in which the attenuation function portion 124 is applied to just one of the charge sampling circuit portions. However, as shown in FIG. 17, the attenuation function portion 124 may be applied to all of the charge sampling circuit portions of a charge domain filter circuit 112.

Figure 17:
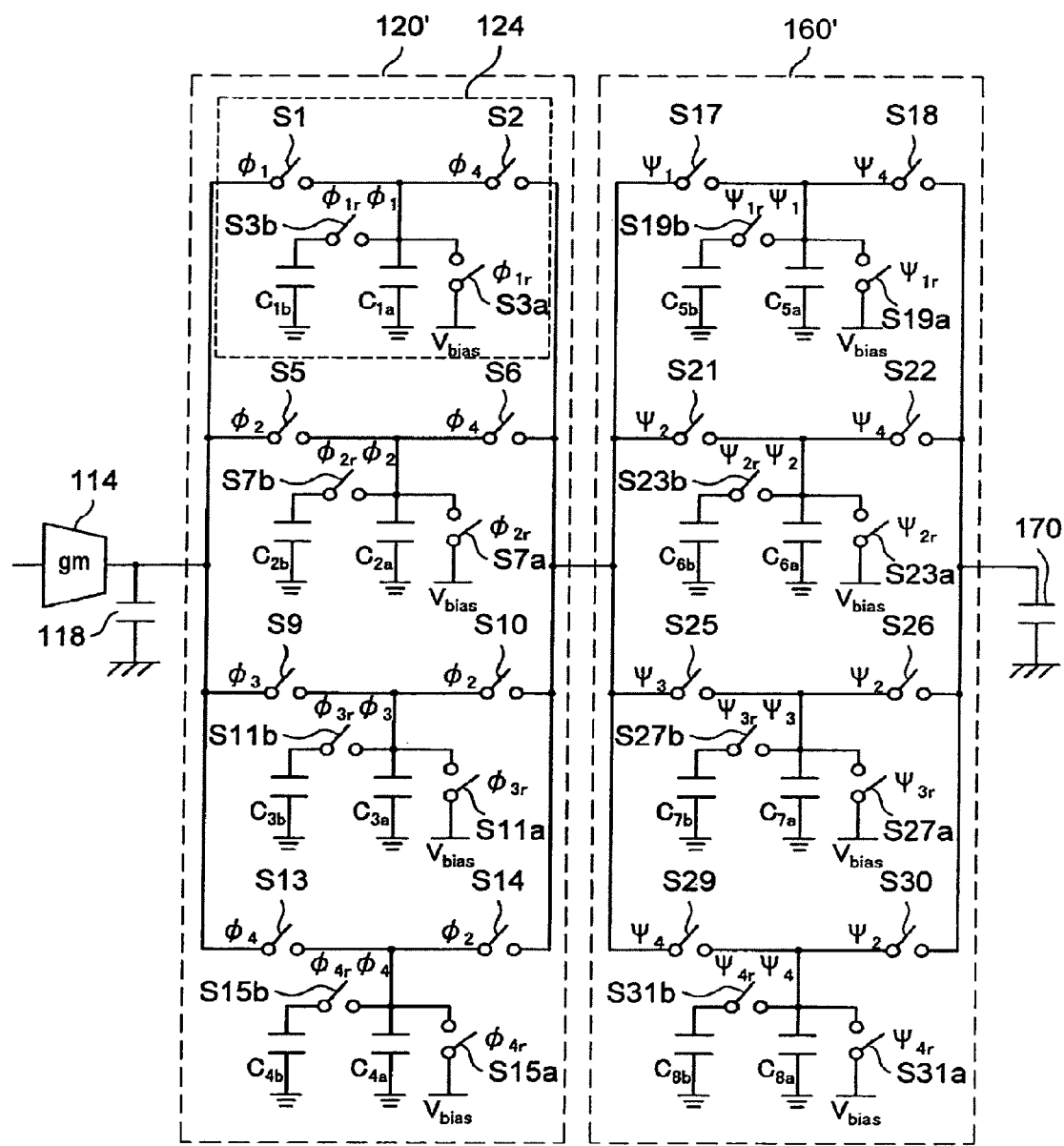
FIG. 17 An explanatory figure that shows a circuit configuration of a charge domain filter circuit according to a modified example of the present embodiment.

FIG. 17 is an explanatory figure that shows a circuit configuration of the charge domain filter circuit 112 according to a modified example of the present embodiment. As shown in FIG. 17, the circuit configuration of the attenuation function portion 124 shown in FIG. 11 can be applied to all of the charge sampling circuit portions that configure the charge domain filter circuit 112. According to the above configuration, even in the case that the signal component is not reduced sufficiently just by the first charge sampling circuit portion 120', a second charge sampling circuit portion 160' can further reduce the signal component, thereby allowing a signal with a desired signal level to be obtained. For example, in the case that the each charge sampling circuit portion attenuates the signal component by 6 dB, the first charge sampling circuit portion 120' and the second charge sampling circuit portion 160' can attenuate the signal component by 12 dB.

The invention claimed is:

1. A charge sampling filter circuit which includes a first capacitor that samples an input signal, and in which at least a portion of electric charge stored in the first capacitor by sampling is output to a second capacitor that is connectable with the first capacitor, the charge sampling filter circuit including:
    a switching portion that switches a circuit mode including a sampling mode that causes the first capacitor to sample the input signal, and an output mode that causes the first capacitor and the second capacitor to be connected, wherein
    a capacitance value of the first capacitor when the circuit mode is the output mode is set to be lower than the capacitance value of the first capacitor when the circuit mode is the sampling mode, and
    when the first capacitor operates in one of the circuit modes, the first capacitor can be selectively operated to have a variable capacitance that varies the capacitance value, or to have a fixed capacitance.

2. The charge sampling filter circuit according to claim 1, wherein
    the switching portion switches the circuit mode based on a mode switching signal input in synchronization with a clock, and
    the capacitance value of the first capacitor is changed based on a capacitance value control signal input in synchronization with the clock.

3. The charge sampling filter circuit according to claim 2, wherein a phase of the capacitance value control signal that reduces the capacitance value of the first capacitor is the same phase as the mode switching signal that instructs the switching portion to switch the circuit mode to the output mode.

4. The charge sampling filter circuit according to claim 2, wherein the capacitance value control signal that reduces the capacitance value of the first capacitor is input to the first capacitor during a specified period including a period in which the mode switching signal is input that instructs the switching portion to switch the circuit mode to the output mode.

5. The charge sampling filter circuit according to claim 1, wherein the capacitance value of the first capacitor is variable during times other than a period of the output mode.

6. The charge sampling filter circuit according to claim 1, further comprising:
    the circuit mode additionally includes a discharge mode that discharges electric charge stored in the first capacitor, and
    the switching portion switches the circuit mode to the discharge mode from the end of a period when the circuit mode is the output mode until the start of a period when the circuit mode is the sampling mode.

7. The charge sampling filter circuit according to claim 6, wherein the capacitance value of the first capacitor in the discharge mode is approximately the same as the capacitance value of the first capacitor in the output mode.

8. A device comprising the charge sampling filter circuit of claim 1.

9. A charge sampling filter circuit comprising:
    a unit capacitor group including at least two or more capacitors, and
    a switching portion that switches a circuit mode of the unit capacitor group that includes a sampling mode and an output mode, wherein
    when the circuit mode of the unit capacitor group is switched to the sampling mode by the switching portion, a plurality of capacitors included in the unit capacitor group perform sampling, and
    when the circuit mode of the unit capacitor group is switched to the output mode by the switching portion, only one of the capacitors among the plurality of capacitors outputs electric charge stored by the sampling.

10. The charge sampling filter circuit according to claim 9, wherein at least one of the capacitors included in the unit capacitor group is a variable capacitor having a variable capacitance value.

11. The charge sampling filter circuit according to claim 9, wherein, in the unit capacitor group, the plurality of capacitors and/or the at least one of the capacitors among the plurality of capacitors is selected in accordance with a signal level of a signal input to the charge sampling filter circuit.

12. The charge sampling filter circuit according to claim 9, wherein
    the circuit mode of the unit capacitor group additionally includes a discharge mode that discharges electric charge stored in the plurality of capacitors, and
    the switching portion switches the circuit mode of the unit capacitor group to the discharge mode from the end of a period when the circuit mode is the output mode to the start of a period when the circuit mode is the sampling mode.

13. A charge sampling method, comprising:
    a switching step that switches between a sampling step of sampling an input signal by a first capacitor, and an output step of outputting at least a portion of electric charge stored in the first capacitor by the sampling to a second capacitor that is connected to the first capacitor;
    a step of reducing a capacitance value of the first capacitor in the output step to be lower than the capacitance value of the first capacitor in the sampling step;
    a step of selectively operating the first capacitor to have a variable capacitance that varies the capacitance value or to have a fixed capacitance, when the first capacitor operates in the sample step or in the output step; and
    a discharge step of discharging electric charge stored in the first capacitor.

* * * * *